United States Patent
Fischer et al.

(10) Patent No.: US 10,103,343 B2
(45) Date of Patent: *Oct. 16, 2018

(54) VERTICAL ORGANIC TRANSISTOR, CIRCUIT CONFIGURATION AND ARRANGEMENT WITH VERTICAL ORGANIC TRANSISTORS AND METHOD OF MANUFACTURING

(71) Applicant: Novaled GmbH, Dresden (DE)

(72) Inventors: Axel Fischer, Dresden (DE); Bjoern Luessem, Dresden (DE); Karl Leo, Dresden (DE)

(73) Assignee: NOVALED GMBH, Dresden (DE)

(*) Notice: Subject to any disclaimer, the term of this patent is extended or adjusted under 35 U.S.C. 154(b) by 176 days.

This patent is subject to a terminal disclaimer.

(21) Appl. No.: 14/109,637

(22) Filed: Dec. 17, 2013

(65) Prior Publication Data

US 2014/0284567 A1    Sep. 25, 2014

(30) Foreign Application Priority Data

Dec. 20, 2012 (DE) .......................... 10 2012 112 796

(51) Int. Cl.
| H01L 29/08 | (2006.01) |
| H01L 51/00 | (2006.01) |
| H01L 33/00 | (2010.01) |
| H01L 51/05 | (2006.01) |
| H01L 27/28 | (2006.01) |

(52) U.S. Cl.
CPC .......... *H01L 51/057* (2013.01); *H01L 27/283* (2013.01); *H01L 51/0001* (2013.01); *H01L 51/0026* (2013.01); *H01L 51/0074* (2013.01)

(58) Field of Classification Search
CPC .............................. H01L 51/52; H01L 33/06
USPC ............ 257/13, 40, 59, 98, 99; 438/46, 778
See application file for complete search history.

(56) References Cited

U.S. PATENT DOCUMENTS

| 5,349,599 A * | 9/1994 | Larkins .................... G02F 3/026 |
| | | 257/E33.047 |
| 6,774,052 B2 | 8/2004 | Vigeli et al. |
| 6,884,093 B2 | 4/2005 | Baldo et al. |
| 2005/0189875 A1* | 9/2005 | Nakada ............... H01L 27/3209 |
| | | 313/504 |
| 2005/0221121 A1* | 10/2005 | Ishihara .............. H01L 51/5036 |
| | | 428/690 |
| 2006/0250076 A1* | 11/2006 | Hofmann .............. H01L 51/002 |
| | | 313/504 |

(Continued)

OTHER PUBLICATIONS

Cheng et al., "Using Metal/Organic Junction Engineering to Prepare an Efficient Organic Base-Modulation Triode and its Inverter," Organic Electronics, 2009, 1636-1640.

(Continued)

*Primary Examiner* — Sheikh Maruf
(74) *Attorney, Agent, or Firm* — Eversheds Sutherland (US) LLP

(57) ABSTRACT

The application relates to a vertical organic transistor having a layer structure on a substrate. The layer structure includes an electrode, a counter-electrode, and an electronically active layer arrangement which is disposed between the electrode and the counter-electrode. The application further relates to a method for fabricating a vertical organic transistor and a circuit arrangement.

17 Claims, 26 Drawing Sheets

(56) References Cited

U.S. PATENT DOCUMENTS

| | | | |
|---|---|---|---|
| 2007/0176166 A1* | 8/2007 | Lin | H01L 51/0504 257/40 |
| 2007/0254402 A1* | 11/2007 | Dimmler | H01L 51/0022 438/99 |
| 2008/0006826 A1* | 1/2008 | Kawachi | H01L 29/7317 257/70 |
| 2008/0042152 A1* | 2/2008 | Kawachi | G11C 11/412 257/89 |
| 2008/0197765 A1* | 8/2008 | Sung | H05B 33/10 313/503 |
| 2009/0009071 A1* | 1/2009 | Murano | H01L 51/5052 313/504 |
| 2009/0103281 A1* | 4/2009 | Koh | G02F 1/133604 362/97.1 |
| 2009/0230856 A1* | 9/2009 | Tsutsui | H01L 51/0021 313/504 |
| 2009/0261354 A1* | 10/2009 | Ha | H01L 51/5278 257/87 |
| 2009/0315043 A1 | 12/2009 | Nakamura et al. | |
| 2010/0019231 A1* | 1/2010 | Smith | H01L 51/057 257/40 |
| 2010/0090202 A1 | 4/2010 | Obata et al. | |
| 2010/0133517 A1 | 6/2010 | Lee et al. | |
| 2010/0157585 A1* | 6/2010 | Diekmann | F21S 6/002 362/228 |
| 2010/0213447 A1* | 8/2010 | Fujimoto | B82Y 20/00 257/40 |
| 2011/0156059 A1* | 6/2011 | Reineke | H01L 51/5016 257/79 |
| 2012/0168801 A1* | 7/2012 | Xuan | H01L 33/02 257/98 |
| 2012/0299470 A1* | 11/2012 | Kobayashi | E06B 9/386 313/504 |
| 2013/0015448 A1* | 1/2013 | Yang | H01L 27/1251 257/59 |
| 2013/0181208 A1 | 7/2013 | Guo | |
| 2013/0240831 A1* | 9/2013 | Lo | H01L 33/36 257/13 |
| 2014/0014937 A1* | 1/2014 | Ide | H01L 51/5044 257/40 |

OTHER PUBLICATIONS

Fischer et al., "An All C60 Vertical Transistor for High Frequency and High Current Density Applications," Applied Physics Letters, 2012, 101:213303-1-213303-4.

Fujimoto et al., "Fabrication of a Vertical-Type Organic Transistor with a Planar Metal Base," Applied Physics Letter, 2005, 87:133503-1-133503-3.

Nakayama et al., "High-Current and Low-Voltage Operation of Metal-Base Organic Transistors with LiF/Al Emitter," Applied Physics Letters, 2006, 88:153512-153512-3.

Watatnabe et al., "Improvement in On/Off Ratio of Pentacene Static Induction Transistors with Ultrathin CuPc Layer," Japanese Journal of Applied Physics, 2006, 45(4B):3698-3703.

German Office Action for DE Application No. 10 2012 112 796.4 dated Aug. 5, 2016 (7 pages).

\* cited by examiner

VERTICAL ORGANIC TRANSISTOR, CIRCUIT CONFIGURATION AND ARRANGEMENT WITH VERTICAL ORGANIC TRANSISTORS AND METHOD OF MANUFACTURING

FIELD OF THE INVENTION

The invention relates to technologies in the field of the vertical organic transistor.

BACKGROUND

Vertical organic transistors are semiconductor components having three electrodes. In particular organic molecules, carbon compounds and polymers are used as semiconducting layers. The device has a plurality of superposed planar layers which are fabricated on a substrate. Since the currents in the device flow perpendicular to the functional layers and therefore also to the device, it is designated as vertical device.

The following tasks or functions are ascribed to the vertical organic transistor: amplifying currents and/or voltages, electrical switches in order to control the current flow through subsequent devices, executing logic operations in combination with a plurality of devices and various tasks of analogue signal processing.

An advantage of organic transistors with vertical current flow lies in the short length between the electrodes, which can be adjusted very accurately by means of vapour deposition of materials in vacuum. This reduces the time required for a charge carrier to traverse the organic semiconductor. High switching speeds are thus obtained, these being required, for example, for the active triggering of screens with organic light-emitting diodes (OLED).

In addition, as a result of the small dimensions of a few hundred nanometres, even at low voltages, which typically lie below 5 V, very high electric fields are achieved. As a result, high current densities are achieved in the device, which are sufficient to bring a downstream OLED to application-relevant brightness. Furthermore, OLEDs are also designed so that the currents flow vertically to the substrate, and vertical organic transistors have the same architecture and are therefore suitable for being processed consecutively in a fabrication process. This results in a higher packing density and a higher proportion of the area of a screen which can contribute to the emission of information.

Known from the document US 2010/0213447 A1 is a vertical organic transistor in which a middle electrode is configured as a continuous layered body which contains an isolating metal compound and metal particles which are distributed in the insulating compound.

The document U.S. Pat. No. 6,884,093 B2 discloses an organic semiconductor device in which a middle electrodes in an organic layer arrangement is formed with a conducting grid material.

The document U.S. Pat. No. 6,774,052 B2 describes a method for fabricating a permeable base transistor in which a base layer is deposited in a semiconductor substrate and a semiconductor layer grows on the base layer, where the base layer comprises metal nanotubes.

Vertical organic transistors are further known as such from the following documents: Nakayama et al., Appl. Phys. Lett., 2006, 88, Cheng et al., Org. Electron., 2009, 10, Watanabe et al., Jpn. J. Appl. Phys., 2006, 45, Fujimoto et al., Appl. Phys. Lett., 2005, 87.

Applications at high frequencies and high current densities have also been described for organic vertical transistors (Fischer et al, Appl. Phys. Lett., 2012, 213303).

So-called mask technology can be used to fabricate a vertical organic transistor or circuit arrangements herewith. In this case, the device layers are deposited using mask structures which have one or more openings through which the respective layer is deposited in a desired area of the device. The accuracy of the layer deposition in a desired area depends in particular on the tolerances of the mask structure itself as well as the positioning accuracy of the mask structure. As a result, defective structures occur, particularly in the outer edge region of the vertical organic transistor to be fabricated, in which the desired layer overlap is defective. For example, it can occur that the control electrode (middle electrode) of the transistor only overlaps with an organic layer on one side so that fault currents occur here which are not available for the correct operation of the transistor.

BRIEF SUMMARY

It is the object of the invention to provide improved technologies for a vertical organic transistor as well as circuit arrangements comprising a vertical organic transistor with which the influence of fault currents during operation can be minimised or completely avoided.

This object is solved by a vertical organic transistor as well as a circuit arrangement as provided herein. Furthermore an arrangement comprising a vertical organic transistor is provided. Furthermore, a method for fabricating a vertical organic transistor is provided.

According to one aspect, a vertical organic transistor comprising a layer structure is fabricated on a substrate. Said layer structure comprises an electrode, a counter-electrode and an electronically active layer arrangement which is disposed between the electrode and the counter-electrode. Said electronically active layer arrangement comprises one or a plurality of layers of organic material. In the electronically active layer arrangement, a control electrode is provided which is also designated as middle electrode. The control electrode allows a passage of electronic charge carriers injected by the electrode into the layer arrangement through the control electrode so that during operation of the vertical organic transistor the electric charge carriers injected into the electronically active layer arrangement can be transported from the electrode through the layer arrangement to the counter-electrode. A current flow which can be controlled with the aid of the control electrode is thus produced. In the electronically active layer arrangement furthermore an organic layer as well as a further organic layer of organic material is provided, which layers are disposed between the control electrode and the electrode, as well as the electrode and the counter-electrode. The layers of organic material form transport layers into which the injected charge carriers are transported in the form of holes and/or electrons. With the aid of a functional layer disposed in the electronically active layer arrangement, a region which is active during operation for transport of the injected electric charge carriers from the electrode through the layer arrangement to the counter-electrode and a region which is non-active during operation are patterned at least in sections in the layer arrangement.

The at least sectional patterning of active region and non-active region in the layer arrangement is a patterning formed in the device surface. The functional layer can surrounding the active and/or the non-active region on one side, on many sides or even completely in a patterning manner. In the non-active region the functional layer inhibits possible transport of electric charge carriers between the electrode and/or the counter-electrode on the one hand and the middle electrode on the other hand or even completely prevents this within measurement accuracy for such a fault current.

The patterning of the active region of the vertical organic transistor provided with the aid of the functional layer makes it possible to avoid randomnesses in the device structure which can occur according to the prior art as a result of tolerances in the use of mask technology. With the aid of the functional layer which can be formed with one layer or with a plurality of sublayers, a specific and reproducible delimitation between active and non-active region is thus accomplished.

One or a plurality of vertical organic transistors designed in such a manner can be provided in a circuit arrangement in order to provide one or more devices from the following group of devices in the circuit arrangement: inverter and logic gate such as OR or NAND gate.

Furthermore, an arrangement comprising a vertical organic transistor and an organic device, for example, an organic light-emitting device, is provided which is disposed as a further layer structure on the vertical organic transistor and is functionally connected herewith. Transistor and further device can be coupled to one another by means of a common electrode. However, an electrode-free coupling between transistor and device stacked hereon can also be provided. For example, two transport layers of which at least one transport layer can be electrically doped as desired can, in direct contact, form the junction between transistor and device.

When connecting together or when stacking devices one above the other, a patterning of active and non-active region overlapping a device can be provided in the electronically active layer arrangement between outer electrodes.

A further development provides that an electric operating current in the active region is at least one order of magnitude greater than a fault current in the non-active region. Within a given measurement accuracy, no fault or cut-off current can be measured in the non-active region. It can be provided that the electric operating current in the active region is at least two orders of magnitude, and further preferably at least three orders of magnitude, greater than the fault current. With an area ratio of active region to non-active region of about 0.9, it can be provided that the current density in the non-active region is at least a factor of 100 smaller than the current density in the active region. With an area ratio of about 0.5, the current density in the non-active region can be at least a factor of 1000 smaller. In the case of an area ratio of about 0.1, it can be provided that the current density in the non-active region is a factor of 1000 smaller.

In one embodiment it can be provided that the one or the plurality of functional layers comprise an electrically insulating layer which extends at least in the non-active region. The electrically insulating layer can be single- or multilayer. The electrically insulating layer inhibits or prevents any transport of electric charge carriers, which were injected into the layer arrangement, in the electronically or electrically active layer arrangement between the electrode and the counter-electrode. In this way, a type of passive structuring is achieved which therefore inhibits or completely prevents the transport of electric charge carriers injected into the layer arrangement in the region (non-active region) in which the electrically insulating layer is formed.

In this or other embodiments it can be provided that an injection layer is formed on the electrode and/or the counter-electrode in the electronically active layer arrangement. The one or the plurality of injection layers can be designed as a doping layer. This comprises a doping material, be it organic or inorganic, which forms an electric dopant for an organic layer of organic material disposed adjacent to the respective injection layer. The organic layer therefore consists of a material which can be used as matrix material in connection with the doping material. In another embodiment the respective injection layer is designed as an electrically doped layer in which an electric dopant is embedded in a matrix material in such a manner that a partial charge transfer takes place between dopant and matrix material so that the density of free charge carriers is increased. The injection layer can be fabricated in direct touching contact with the respectively adjacently disposed electrode.

One embodiment provides that the electrically insulating layer is disposed adjacent to the middle electrode. The electrically insulating layer can be formed in direct contact with the control electrode (middle electrode). Alternatively the electrically insulating layer is separated from the control electrode by one or a plurality of intermediate layers. The distance between opposite surfaces between the control electrode and the electrically insulating layer can be smaller than that for mutually opposite surfaces of the electrically insulating layer and the counter-electrode/electrode. The electrically insulating layer can be disposed above or below the middle electrode in relation to the substrate.

One further development can provide that the electrically insulating layer is disposed adjacent to the electrode or counter-electrode. The electrical insulating layer can be formed in direct touching contact with the electrode/counter-electrode. In this embodiment, the distance between mutually opposite surfaces of the electrically insulating layer and the electrode/the counter-electrode can be smaller than the distance between mutually opposite surfaces of the electrically insulating layer and the control electrode.

In one embodiment it can be provided that the one or the plurality of functional layers have a patterned injection layer which extends at least in the active region. In this embodiment, an injection layer region is formed in the active region on the electrode and/or the counter-electrode, which promotes the transition of electric charge carriers from the electrode and/or the counter-electrode into the electronically active layer arrangement (injection) and/or the transition of electric charge carriers from the electrically active layer arrangement into the electrode/the counter-electrode compared to adjacent device regions (non-active region). This can be designated as active patterning of the device. The injection layer region can be designed as single- or multilayer. The injection layer region can be combined with an injection-inhibiting layer at the electrode and/or the counter-electrode. The injection-inhibiting layer constitutes an additional inhibition of injection for electric charge carriers from the respective electrode into the electronically active layer arrangement which can develop its effect completely outside the active region (i.e. in the non-active region). In the active region the injection-inhibiting layer interacts with the injection layer region so that in the active region overall injection is promoted as compared to the non-active device region. Passive and active patterning can be used individually and in combination in a vertical organic transistor for the patterning of active and non-active regions.

A further development can provide that the patterning injection layer contains an electrically doped semiconductor material in which an electrical dopant is embedded in a matrix material. An organic semiconductor material can be used as matrix material. The injection layer region can consist of an electrically doped semiconductor material.

A further development provides that the patterning injection layer comprises a dopant layer region consisting of a doping material, where the doping material is an electrical dopant for the organic semiconductor material of the organic layer and/or an electrical dopant for the organic semiconductor material of the first organic layer. The charge-carrier-injection inhibiting functional layer can be electrically doped where preferably an electrical doping opposite to the injection layer region is provided. For example, the injection layer region can be provided with an n-doping whereas the charge-carrier-injection inhibiting functional layer is provided with a p-doping. The interaction of p and n doping then effects the structuring of active and non-active region or contributes to this.

For the layer(s) of organic material, in particular the charge-carrier transporting layers (transport layers) C60, Me-PTCDI (perylene-3,4,9,10-tetracarboxylic acid-N,N'-dimethyl-diimide) or pentacene can be used, in particular in order to provide an electron-conducting transistor. In order to provide a hole-conducting transistor, pentacene, C60, ZnPC (zinc phthalocyanine), CuPC (copper phthalocyanine), NPB (N,N'-di(naphthalen-1-yl)-N,N'-diphenyl-benzidine), meo-TPD (N,N,N',N'-tetrakis(4-methoxyphenyl)-benzidine) or DNTT (dinaphtho[2,3-b:2',3'-f]thieno[3,2-b]-thiophene) can be used for the layer(s) of organic materials.

It can be provided that if the vertical organic transistor is of the hole-conducting type, F6-TCNNQ, 2,2',2"-(cyclopropan-1,2,3-triyl idene)tris(2-(2,3,5,6-tetrafluoro-4-(trifluoromethyl)phenyl)-acetonitrile), 2,2',2"-(cyclopropan-1,2,3-triyliden)tris(2-(p-cyanotetrafluorophenyl)-acetonitrile), F4-TCNQ, WO3, MoO3 or similar materials which have the property of possessing free energy states at room temperature which lie in the vicinity of the hole-conducting transport level of the matrix material, can be used as p-doping materials.

An advantageous embodiment provides that if the vertical organic transistor is of the electron-conducting type, W2(hpp)$_4$ (tetrakis(1,3,4,6,7,8-hexahydro-2H-pyrimido[1,2-a]pyrimidinato)-ditungsten (II)), Cr2(hpp)$_4$ (tetrakis(1,3,4,6,7,8-hexahydro-2H-pyrimido[1,2-a]pyrimidinato)-dichromium (II)), Cs, N1,N4-bis(triphenylphosphoranylidene) benzene-1,4-diamine, or similar materials which have the property of possessing occupied energy states at room temperature which lie in the vicinity of the electron-conducting transport level of the matrix material, can be used as n-doping materials.

The above-mentioned molecules and materials can also be used in dopant layers without matrix material.

Molecules or materials can function as electrical dopants in a matrix material, in particular in the patterning injection layer(s) if they lower/set the energy barrier for a corresponding type of charge carrier, electrons and/or holes of a metal into an adjacent molecular layer to a value of less than 0.5 eV. This occurs when the electrical dopant in the case of the p-doping is a LUMO which lies no more than about 0.5 eV above the HOMO of the hole transport matrix to be doped. The energy scale is defined here so that HOMOs and LUMOs have negative values and the vacuum level is 0 eV. In the case of the electrical n-dopant, the HOMO of the n-dopant should be no further than about 0.5 eV below the LUMO of the electron transport material to be doped. The HOMO of the n-dopant here relates to the part of the molecule active as dopant if the doping molecule in the layer fabrication process is only formed from a precursor molecule.

Molecules or materials can be used to form charge-carrier injection inhibiting layers if they increase/set the energy barrier for a corresponding type of carrier, electrons and/or holes. from a metal into an adjacent molecular layer to a value of higher than 0.2 eV, preferably of higher than 0.25 eV.

The electrically insulating layer can consist of molecules which for the charge carriers in the associated layer of organic material (transport layer) introduces an additional energy barrier at the interface between transport layer and patterning functional layer, which is preferably at least about 0.3 eV. Furthermore, molecular layers having a charge carrier mobility can be used, which, according to the required current ratio between active and non-active regions, is a multiple lower than the charge carrier mobility of the transport layer.

The following molecules can be used for the electrically insulating layer: BPAPF (9,9-bis[4-(N,N-bis-biphenyl-4-yl-amino)phenyl]-9H-fluorene), spiro-TTB (spirotetra(p-methyl-phenyl)-benzidine), spiro-TAD (2,2',7,7'-tetrakis-(N,N-diphenylamino)-9,9'-spirobifluorene), Meo-TPD (N,N,N',N'-tetrakis(4-methoxyphenyl)-benzidine), TCTA(4,4',4"-tris(carbazol-9-yl)-triphenylamine), NPB (N,N'-di(naphthalen-1-yl)-N,N'-diphenyl-benzidine) and/or BF-DPB (N,N'-((diphenyl-N,N-bis)9,9,-dimethyl-fluoren-2-yl)-benzidine). Furthermore, oxide materials can be used, for example, silicon dioxide (SiO2), aluminium oxide (Al2O3), titanium(IV)-oxide (TiO2), which can be produced by means of sputtering processes or electron beam evaporation. Also a processing by means of layerwise deposition using atomic layer deposition can be provided. The electrically insulating layers can also be produced by means of spin coating of polymers. The polymers can have a charge carrier mobility which is small compared with the charge carrier mobility of the transport layer or introduces an energy barrier to the transport layer for the corresponding types of charge carrier.

The electrically insulating layers can be temperature-resistant up to a temperature of 150° C. so that their electrically insulating effect is preserved.

The electrical dopants can bring about an n- or a p-doping of the matrix material in such a manner that the matrix material is electrically doped whereby a partial charge transfer takes place between the electrical dopant and the molecules of the matrix material so that the density of the free charge carriers in the respective layer is increased. This corresponds to an electrical doping of the respective matrix material. The molecular dopants can have a molecular weight of >200 g/mol so that they can be inserted in a positionally stable manner into the matrices. Oxidic dopants can be used in one embodiment.

In addition to the patterning of the insulating layers and the doped layers by shadow masks, the use of lithographic techniques, stamp techniques and printing techniques is feasible.

In the case of an electrically doped layer in which a dopant is embedded in a matrix material to increase the density of free charge carriers, the diffusion of dopants in the matrix layer is undesirable, in particular because transport layers made of organic material which have been produced without dopants should not mixed with dopants. In addition, a diffusion of dopants in a patterned doping layer/dopant layer can lead to an undesirable broadening of the active region or even activate regions in which the electrodes of the vertical organic transistor do not overlap. For this reason it can be provided to use electrical dopants whose diffusion length at the process temperatures used is no greater than the thickness of the transport layers (layers of organic material) and smaller than the lateral extent of the active region. Corresponding doping molecules can have similarly large masses or similar or larger volumes compared to the molecules of the transport layer in order to ensure an anchoring of the doping molecules in the matrix of the molecules in the transport layer.

One embodiment of the active patterning can provide that the electrode or the counter-electrode when used as emitter is made of a material in such a manner that in the non-active regions an energy barrier between the electrode and the adjoining transport layer is achieved so that the types of charge carrier (holes/electrons) responsible for the current flow must apply an energy of at least 0.2 eV to enter into the transport layer from the electrode. One possible realisation can be achieved, for example, with pentacene and aluminium.

Materials having high charge transfer mobility, which is preferably above 0.1 cm$^2$/Vs, for example, C60 or pentacene or DNTT (dinaphtho[2,3-b:2',3'-f]thieno[3,2-b]-thiophene) can be used as molecules for the organic layer(s).

It can be provided that a doping concentration in the electrically doped regions is about 2 weight percent. If desired, the doping concentration can lie below about 0.1 weight percent as required and according to the desired charge carrier density in order to ensure the depletion of the layer with a suitable choice of the potentials at the electrodes. In one embodiment the doping concentration can lie above about 10 weight percent in order to support the enrichment of charge carriers in the layer if, as a result for example, the transmission of charge carriers through the middle electrode is promoted.

BRIEF DESCRIPTION OF THE DRAWINGS

Further exemplary embodiments are explained in the following with reference to figures in the drawings. In the figures.

DETAILED DESCRIPTION

Figure 1:
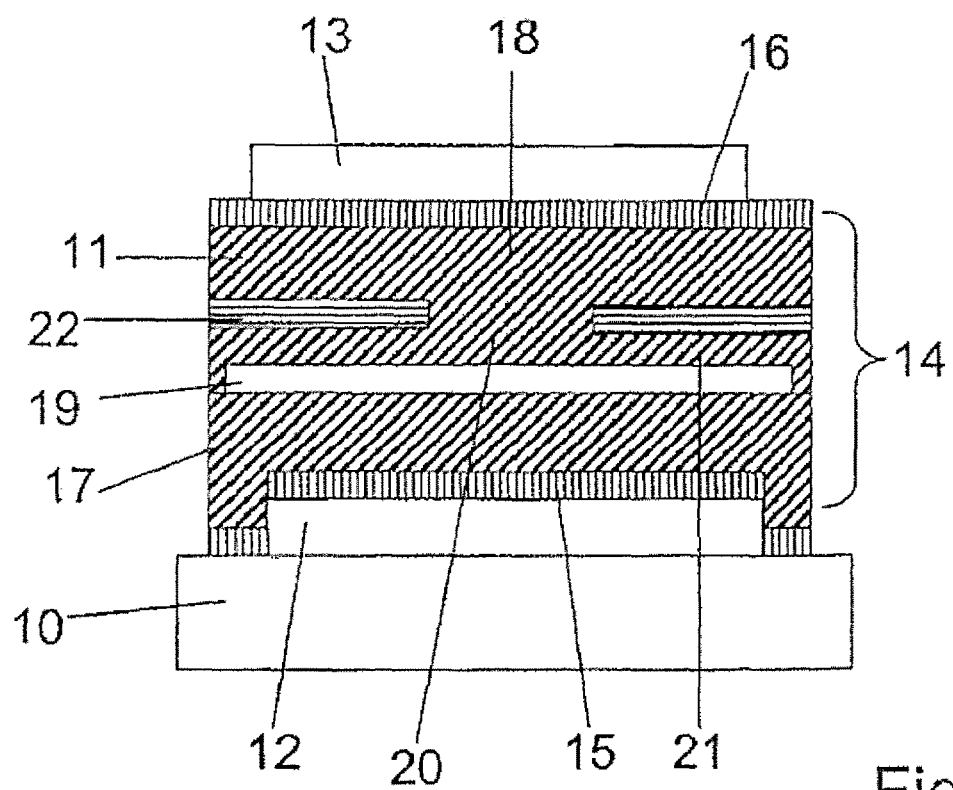
FIG. 1 shows a schematic view of a layer structure for a vertical organic transistor in cross-section, where an electrically insulating functional layer is disposed above a control electrode.

FIG. 1 shows a schematic diagram of a layer structure for a vertical organic transistor in cross-section. A layer structure 11 is deposited on a substrate 10, in which an electrically active layer arrangement 14 is formed between an electrode 12 serving as base electrode 12 and a counter-electrode 13 serving as top electrode. On the side facing the electronically active layer arrangement 14 a respective injection layer 15, 16 is formed on the electrode 12 and the counter-electrode 13. The injection layers 15, 16 can be formed as doping layers which consist of a doping material which comprises an electrical dopant for the organic material of the respectively adjacent organic layer 17, 18. The organic layers 17, 18 serve as transport layers for electrical charge carriers in order to transport these between the electrode 12 and the counter-electrode 13. The transport of the electrical charge carriers is accomplished by a middle electrode 19 which serves as a control electrode. When voltage is applied, during operation the electrode 12, the counter-electrode 13 as well as the middle electrode 19 form the collector, emitter and base of a vertical organic transistor.

The charge carriers injected into the electronically active layer arrangement 14 tunnel through the middle electrode 19 here or pass through openings in the middle electrode 19 in order to finally be collected at the collector.

According to FIG. 1, a functional layer 22 which patterns the layer arrangement 14 into an active region 20 and a non-active region 21 is provided in the electronically active layer arrangement 14, said functional layer being implemented in FIG. 1 as an electrically insulating functional layer. The active region 20 is not covered by the patterning functional layer 22 whereas the non-active region 21 of the electronically active layer arrangement 14 in operation overlaps with the patterning functional layer 22. Whereas the electric charge carriers injected into the electronically active layer arrangement 14 during operation can be transported in the active region 20 from the electrode 12 to the counter-electrode 13 or conversely, in the non-active region 21 this is inhibited or even completely prevented with the aid of the patterning functional layer 22 made of electrically insulating material apart from a possible fault or cut-off current. In this case, electric charge carriers during operation can be injected over the entire area of the counter-electrode 13 into the adjacent organic layer 18 (transport layer). These charge carriers enter in the region of the patterning functional layer 22 but not as far as the middle electrode 19 which avoids a fault current produced as a result.

Figure 2:
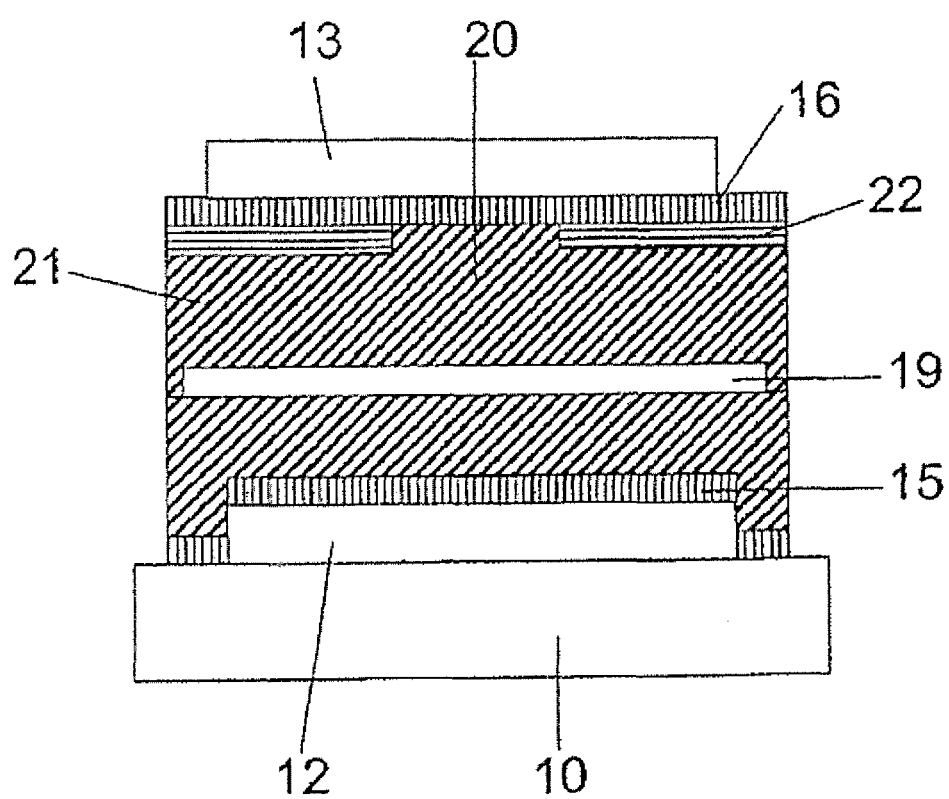
FIG. 2 shows a schematic view of a layer structure for a vertical organic transistor in cross-section, where an electrically insulating functional layer is disposed adjacent to a top electrode.
Figure 3:
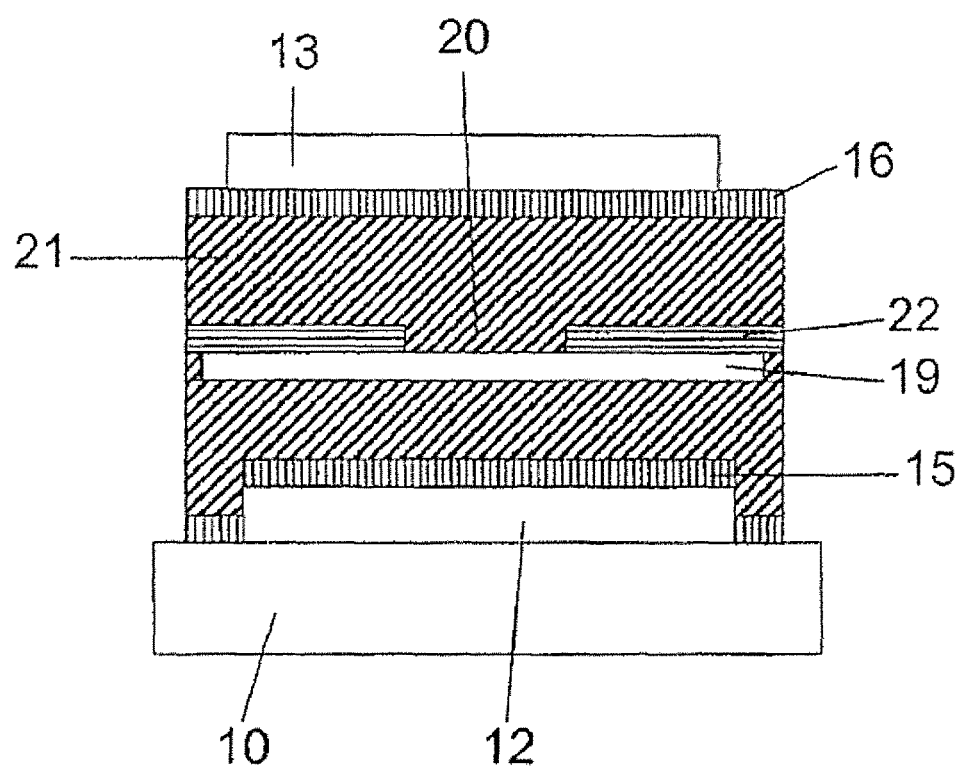
FIG. 3 shows a schematic view of a layer structure for a vertical organic transistor in cross-section, where an electrically insulating functional layer is disposed on the control electrode.
Figure 4:
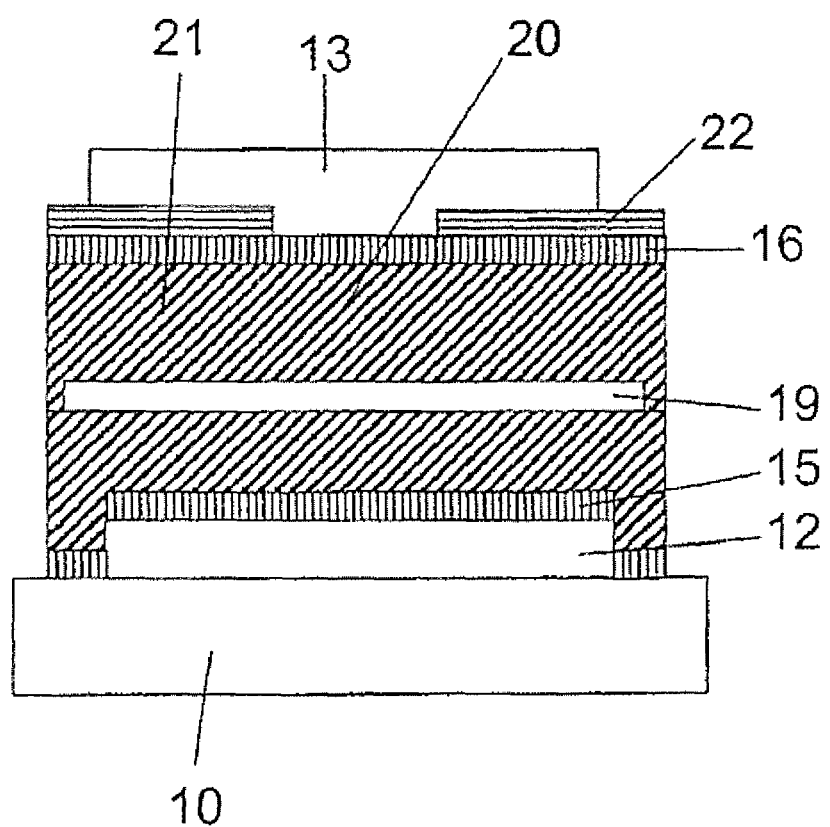
FIG. 4 shows a schematic view of a layer structure for a vertical organic transistor in cross-section, where an electrically insulating functional layer is disposed on the top electrode and in contact herewith.

FIGS. 2 to 4 each show a schematic diagram of a layer structure for a vertical organic transistor, where the patterning functional layer 22 is formed from electrically insulating material compared ti FIG. 1 at different locations in the electronically active layer arrangement 14. In FIG. 2 the patterning functional layer 22 to form the active region 20 and the inactive region 21 is disposed below and in contact with the injection layer 16 on the counter-electrode 13. In FIG. 3 the patterning functional layer 22 is located directly on the middle electrode 19. In the embodiment in FIG. 4 the patterning of the device is formed with the aid of the patterning functional layer 22 disposed between counter-electrode 13 and associated injection layer 16.

Figure 5:
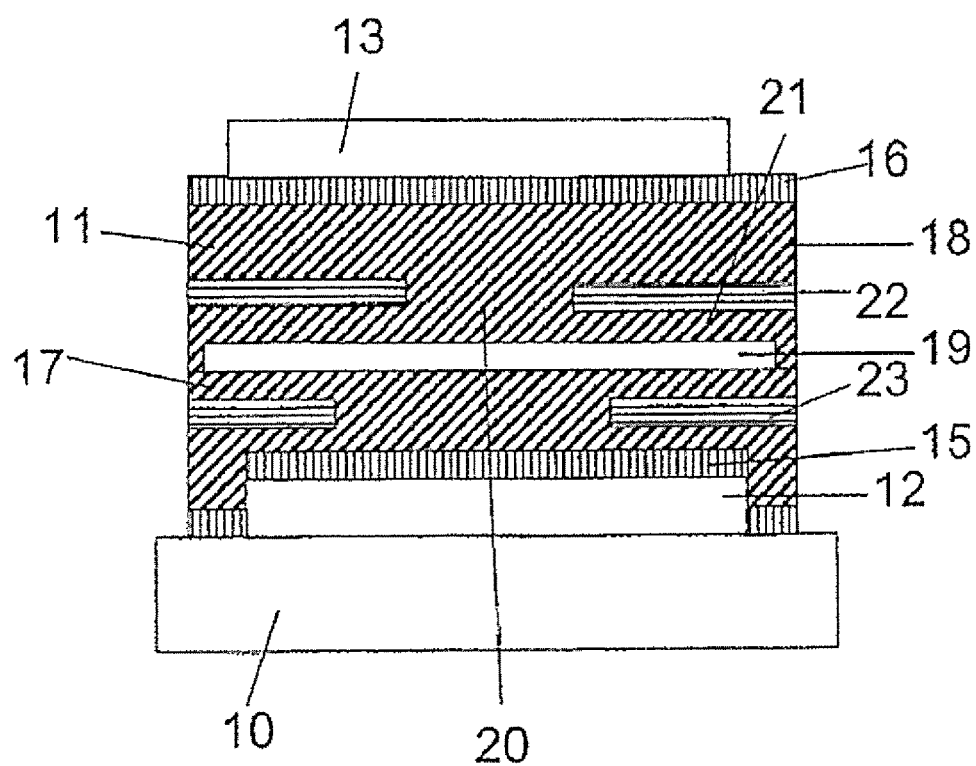
FIG. 5 shows a schematic view of a layer structure for a vertical organic transistor in cross-section, where two electrically insulating functional layers are provided.

FIG. 5 shows an embodiment in which, in addition to the patterning functional layer 22, another patterning functional layer 23 made of electrically insulating material is provided. The patterning functional layer 22 as well as the further patterning functional layer 23 are disposed above and below the middle electrode 19.

The active region 20 is determined by the patterning functional layer 22 located between emitter, i.e. injecting electrode (counter-electrode 13) and middle electrode 19 since this patterning functional layer 22 defines which charge carriers may penetrate as far as the middle electrode 19 and which may not. The additional passive patterning by means of the further patterning functional layer 23 located between middle electrode 19 and charge-carried receiving electrode (collector, electrode 12) serves to suppress possible leakage currents between the two electrodes 12, 13 which in this case should occur as little as possible. These currents define how much current should flow in the off state of the transistor. The second passive patterning by means of the further patterning functional layer 23 can be particularly useful when the active region 20 is very much larger than the overlap between middle electrode 19 and collector since otherwise the leakage current between base and collector remains the same but as a result of the smaller active area, the on currents diminish. The consequence is a reduced on/off ratio of the transistor. The opening of the additional passive patterning does not disturb the current flow in the active region 20 which is defined there by the actual passive patterning by means of the patterning functional layer 22.

Figure 6:
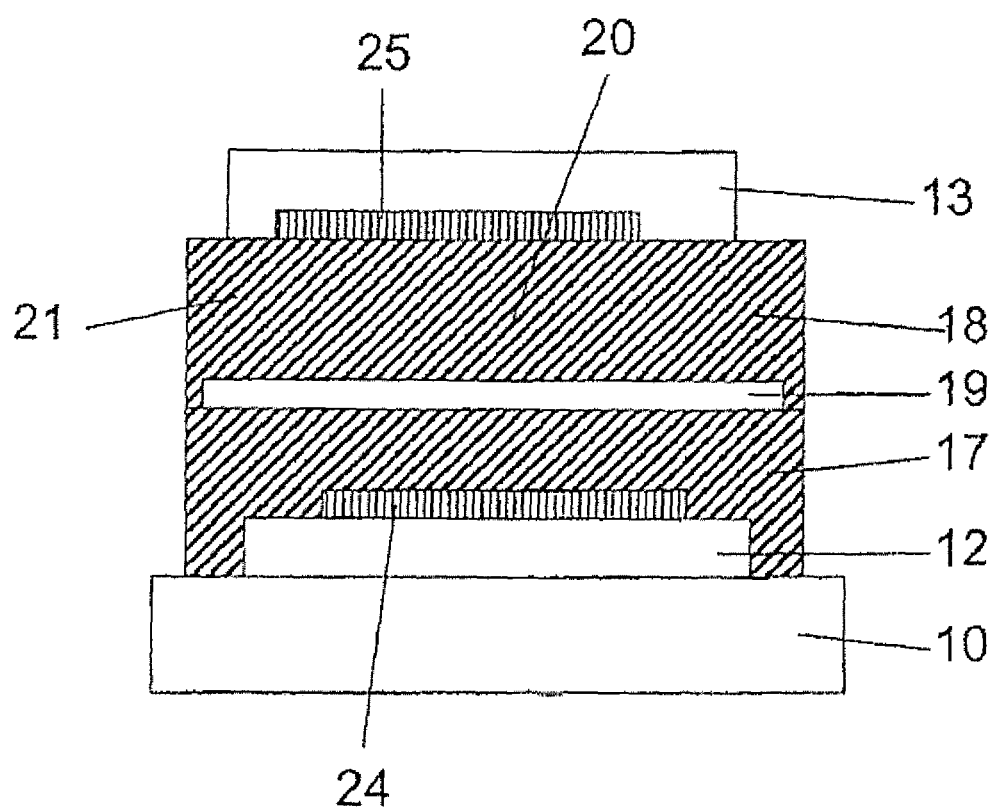
FIG. 6 shows a schematic view of a layer structure for a vertical organic transistor in cross-section, where a patterning injection layer is provided on the base electrode and the top electrode.

The type of patterning of the respective device with the aid of one or more functional layers 22, 23 made of electrically insulating material, described by reference to FIGS. 1 to 5, can be designated as passive patterning. In contrast to this, the embodiment according to FIG. 6 provides a device patterning with the aid of a patterning injection layer 24 and a further patterning injection layer 25 formed on the counter-electrode 13 and the electrode 12. Whereas the injection of electric charge carriers in the region of the two patterning injection layers 24, 25 is promoted, such support of injection does not exist outside the patterning injection layers 24, 25 so that the non-active region(s) 21 of the device are formed in which the injection of electric charge carriers and in this respect the transport of such charge carriers between electrode 12 and counter-electrode 13 is inhibited or completely prevented compared to the active region 20 with the patterning injection layers 24, 25. In the embodiment in FIG. 6 the active region 20 is formed by the overlap region of the two patterning injection layers 24, 25.

Depending on which electrode is used as emitter, merely determines the patterning injection layer which abuts against the emitter over the entire active region 20 as long as the respective injection layer lies in the overlap region of all three electrodes. Accordingly, one of the two patterning injection layers 24, 25 precisely defines the active region 20. The patterning injection layer present at the collector can certainly increase the performance of the device but is not able to prevent the injection of charge carriers so that it has no influence on the active region 20.

Figure 7:
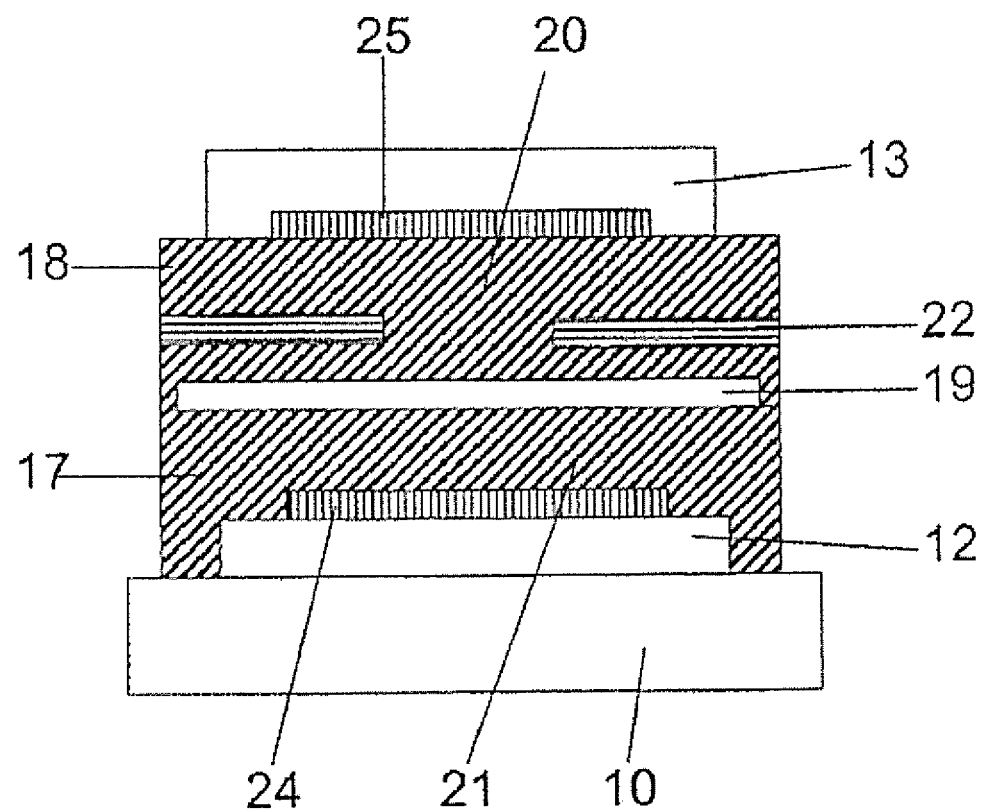
FIG. 7 shows a schematic diagram of the layer structure from FIG. 6, where additionally an electrically insulating functional layer is provided.

FIG. 7 shows a schematic diagram of a layer structure for a vertical organic transistor in which active and passive device patterning are combined with one another. Both the patterning functional layer 22 and the patterning injection layers 24, 25 are provided. An active region 20 is formed in the region of the gap of the patterning functional layer 22 which overlaps completely with the two patterning injection layers 24, 25.

Figure 8:
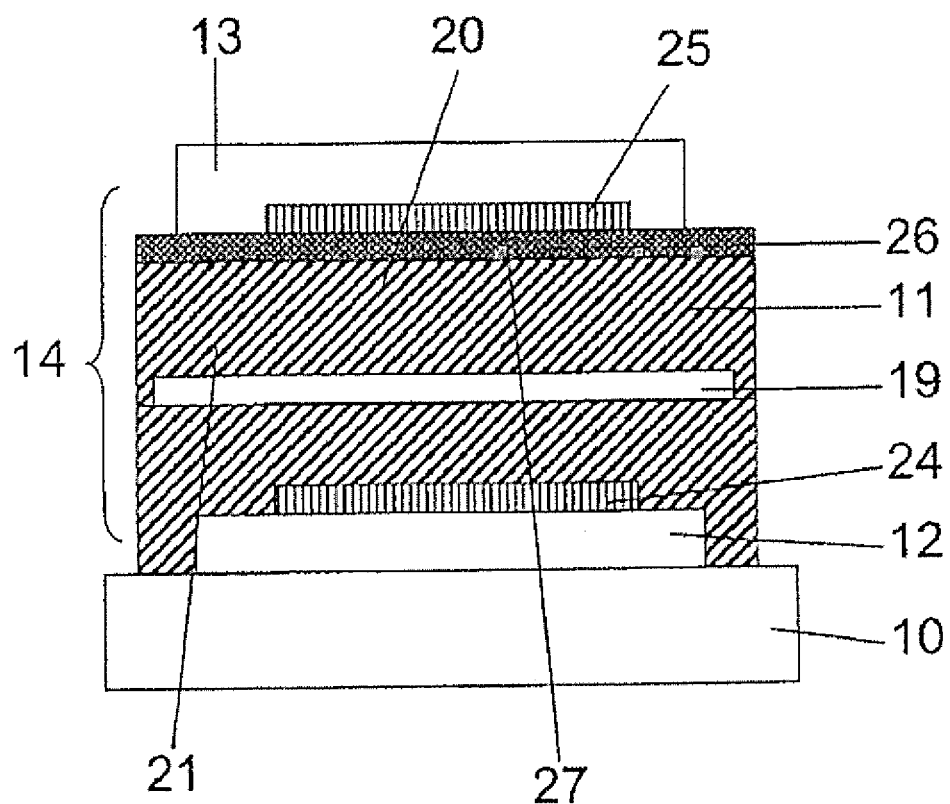
FIG. 8 shows a schematic diagram of the layer structure from FIG. 8, where additionally an injection-inhibiting layer is provided on the top electrode.

FIG. 8 shows an embodiment in which the patterning injection layer 25 adjoins an injection-inhibiting layer 26 which inhibits or even completely prevents charge carrier injection from the counter-electrode 13 in the organic layer 18 formed adjacent thereto insofar as the injection-inhibiting layer 26 is disposed directly between counter-electrode 13 and organic layer 18. In one region 27 the patterning injection layer 25 and the injection-inhibiting layer 26 overlap so that the injection-promoting effect of the patterning injection layer 25 is lessened. The injection-promoting effect is however stronger than the inhibition by the injection-inhibiting layer 26 so that the active region 20 is formed here in which charge carrier injection and charge carrier transport takes place during operation. For example, the injection-inhibiting layer 26 can be provided with an electrical p-doping whereas the patterning injection layer 25 has an electrical n-doping.

Figure 9:
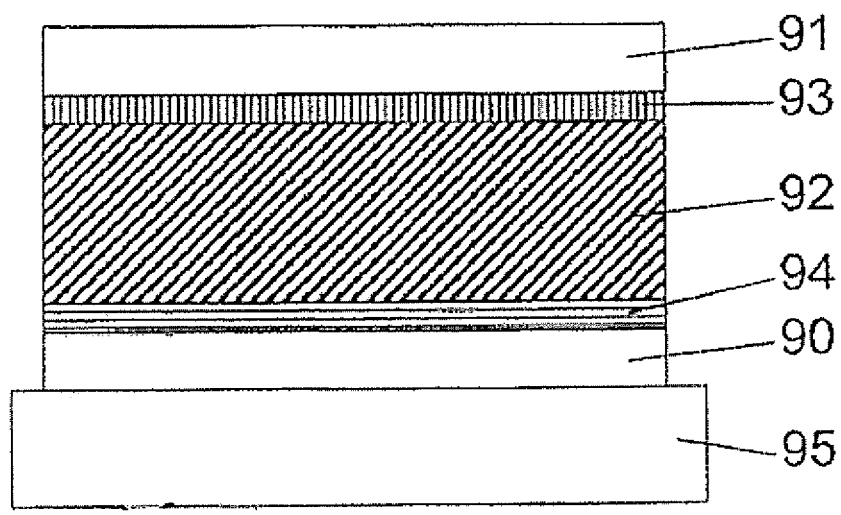
FIG. 9 shows a schematic diagram of a non-patterned comparative layer arrangement.

FIG. 9 shows a schematic diagram of a non-patterned comparative layer arrangement comprising an electrode 90 disposed at the bottom and a counter-electrode 91 disposed at the top as well as a transport layer 92 (molecular layer) and an injection layer 93. Located between the electrode 90 and the transport layer 92 is a non-patterned electrically insulating layer 94. The layers are deposited on a substrate 95, for example, by means of vacuum evaporation as is known in combination with organic devices as such.

Figure 10:
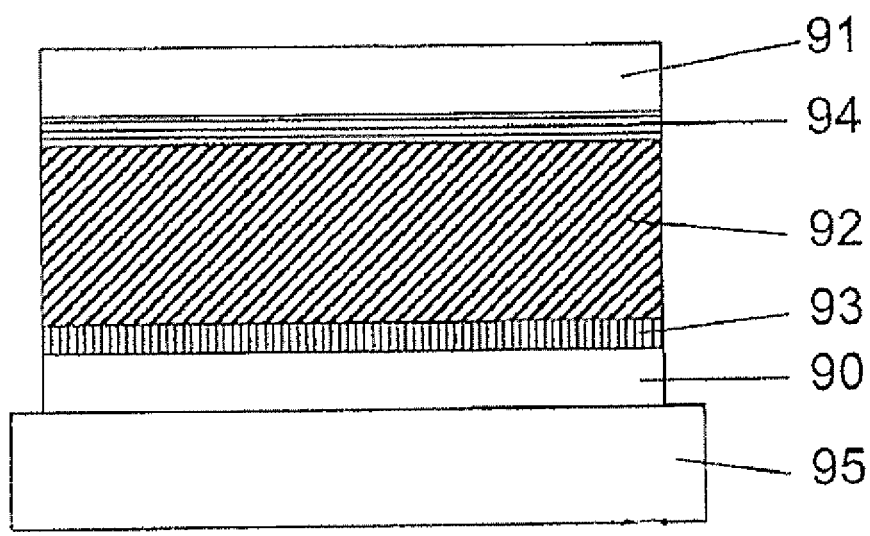
FIG. 10 shows a schematic diagram of another non-patterned comparative layer arrangement.

FIG. 10 shows a schematic diagram of another non-patterned comparative layer arrangement. Compared to FIG. 9, injection layer 93 and non-patterned electrically insulating layer 94 are transposed.

Figure 11:
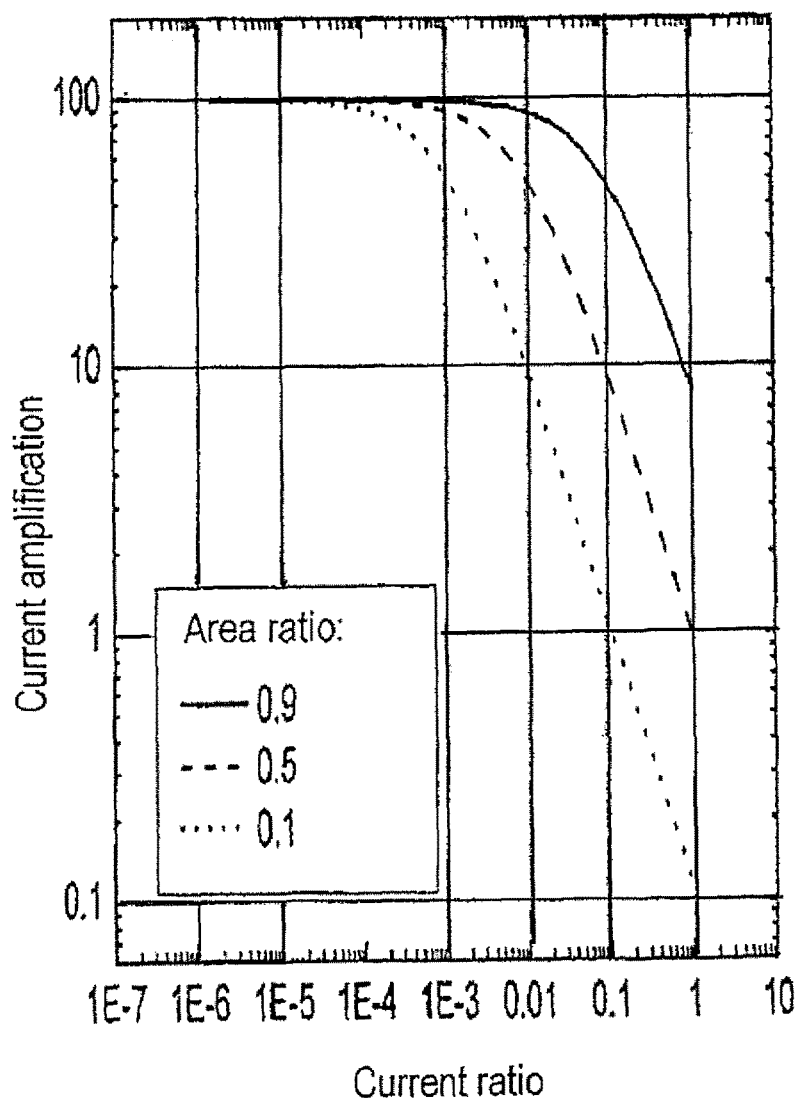
FIG. 11 shows a graphical view of the current amplification as a function of the current ratio.

FIG. 11 shows a graphical diagram of the current amplification as a function of the current ratio, i.e. current density in the non-active region 21 in relation to the current density in the active region 20, of a vertical organic transistor for various area ratios. It is assumed that the vertical organic transistor with an optimal overlap of the electrodes (no non-active regions) has an amplification of 100. The poorer is the area ratio, i.e. the ratio of non-active (area) region to the total overlap area between the electrode serving as emitter and the control electrode, the lower the current ratio must be in order to nevertheless achieve the highest possible amplification of 100. With an area ratio of 0.5, half the overlap area between emitter electrode and control electrode overlaps with the collector electrode (active area). The other half does not overlap with the collector electrode (non-active area). In order to nevertheless achieve a current amplification of almost 100, the current density in the non-active areas can reduced at least by a factor greater than 10. It can be provided that the current density in the non-active areas is at least a factor of 100 smaller, even a factor of at least 1000 (three orders of magnitude) can be provided.

With an area ratio of active region to non-active region of about 0.9, it can be provided that the current density in the non-active region is at least a factor of 100 smaller. With an area ratio of about 0.5, the current density in the non-active area can be at least a factor of 1000 smaller. In the case of an area ratio of about 0.1 it can be provided that the current density in the non-active area is at least a factor of 1000 smaller.

Figure 12:
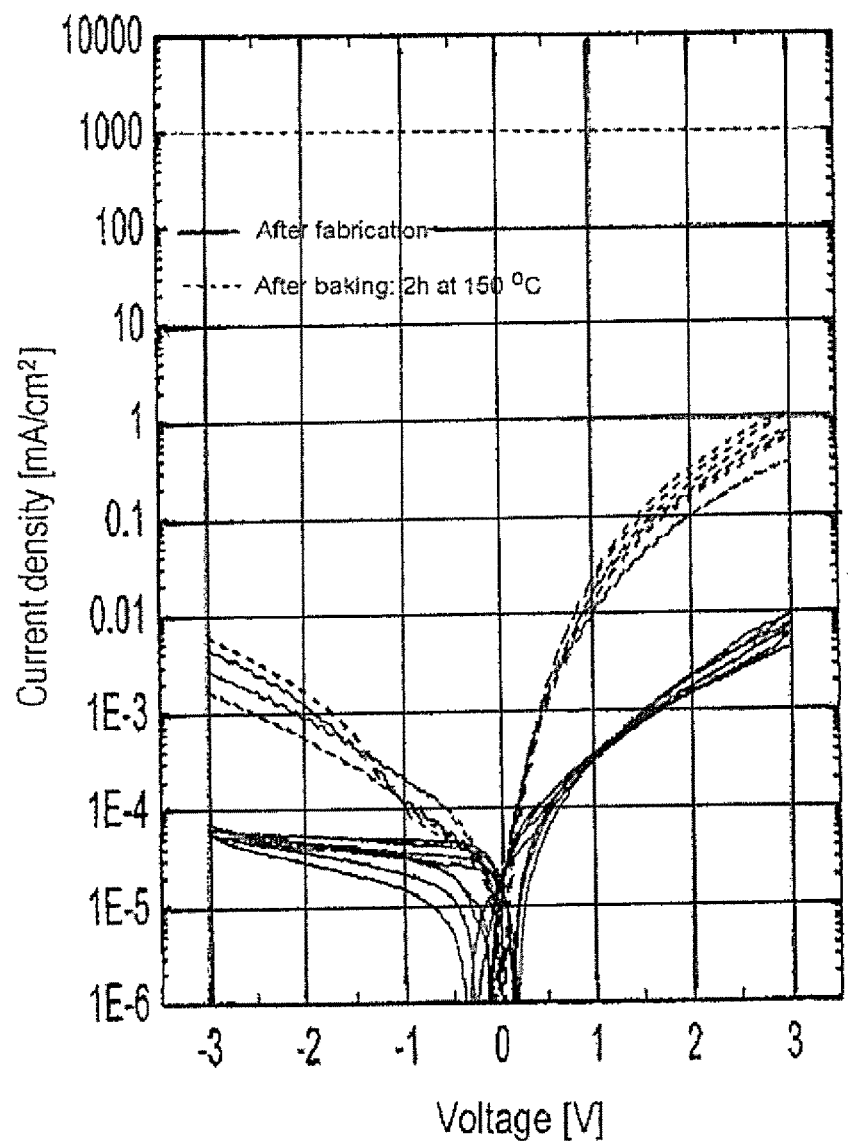
FIG. 12 shows a graphical diagram of the current density as a function of the voltage.

FIG. 12 shows a graphical diagram of the current density as a function of the voltage. A layer structure according to FIG. 9 was tested with the Spiro-TTB molecule as electrically insulating layer 94 (layer thickness: 50 nm). 1000 mA/cm$^2$ at about 1 V to 2V is assumed as reference current density, which is typically achieved by the vertical organic transistor in the on-state. A 100 nm thick C60 layer is used as transport layer 92. A W2(hpp)$_4$ doped C60 layer (20 nm, 1 weight percent of the dopant) is used as upper injection layer 93. The counter-electrode 91 consists of a sequence of 20 nm gold and 100 nm aluminium. The electrode 90 on the substrate 95 consists of 100 nm aluminium. After fabrication, the sample has a current at least five orders of magnitude lower in relation to the reference current density. After a baking step of two hours at 150° C. the current densities certainly increase but are nevertheless three to four orders of magnitude below the reference current density.

Figure 13:
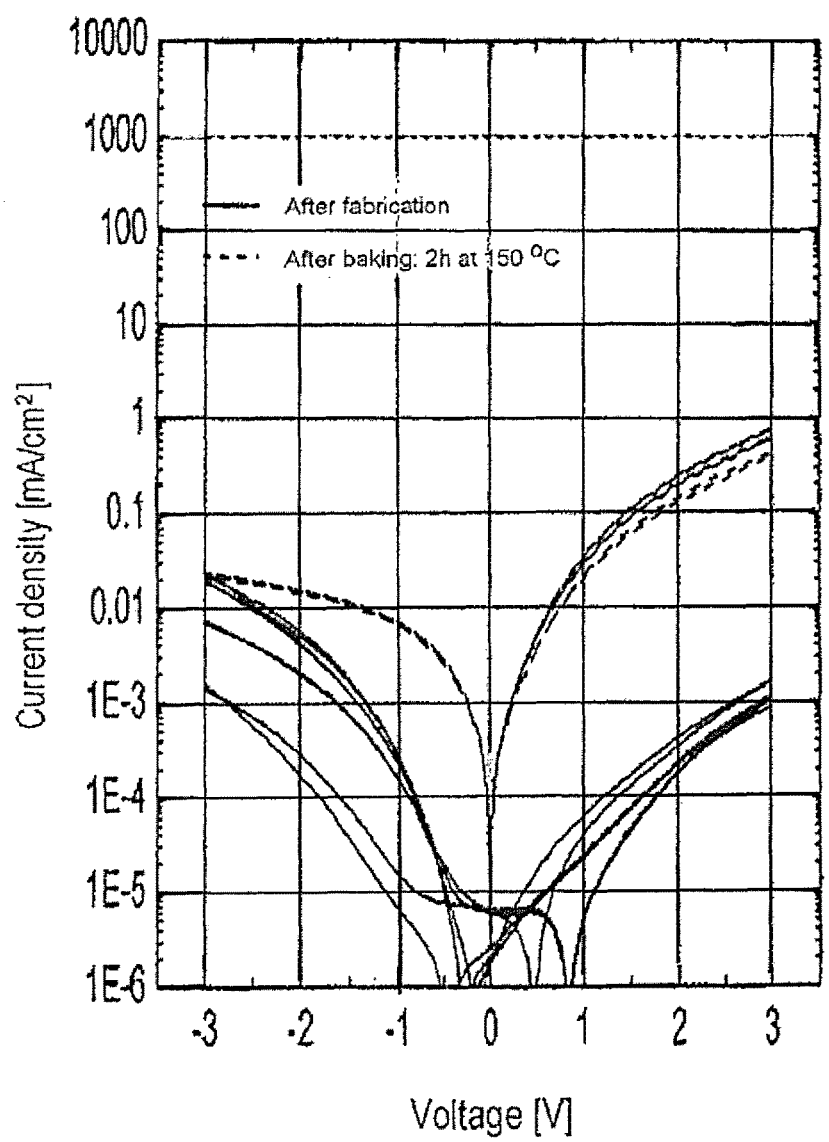
FIG. 13 shows a graphical diagram of the current density as a function of the voltage.

FIG. 13 shows a graphical diagram of the current density as a function of the voltage. A layer structure according to FIG. 10 was tested with the Spiro-TTB molecule as electrically insulating layer 94 (layer thickness: 50 nm). 1000 mA/cm$^2$ at about 1 V to 2V is assumed as reference current density which is typically achieved by the vertical organic transistor in the on-state. A 100 nm thick C60 layer is used as transport layer 92. A W2(hpp)$_4$ doped C60 layer (20 nm, 1 weight percent of the dopant) is used as lower injection layer 93. The electrode 90 consists of a sequence of 100 nm aluminium and 20 nm gold. The counter-electrode 91 consists of 100 nm aluminium. After fabrication, the sample has a current about five orders of magnitude lower in relation to the reference current density. After a baking step of two hours at 150° C. the current densities certainly increase but are nevertheless three to four orders of magnitude below the reference current density.

Figure 14:
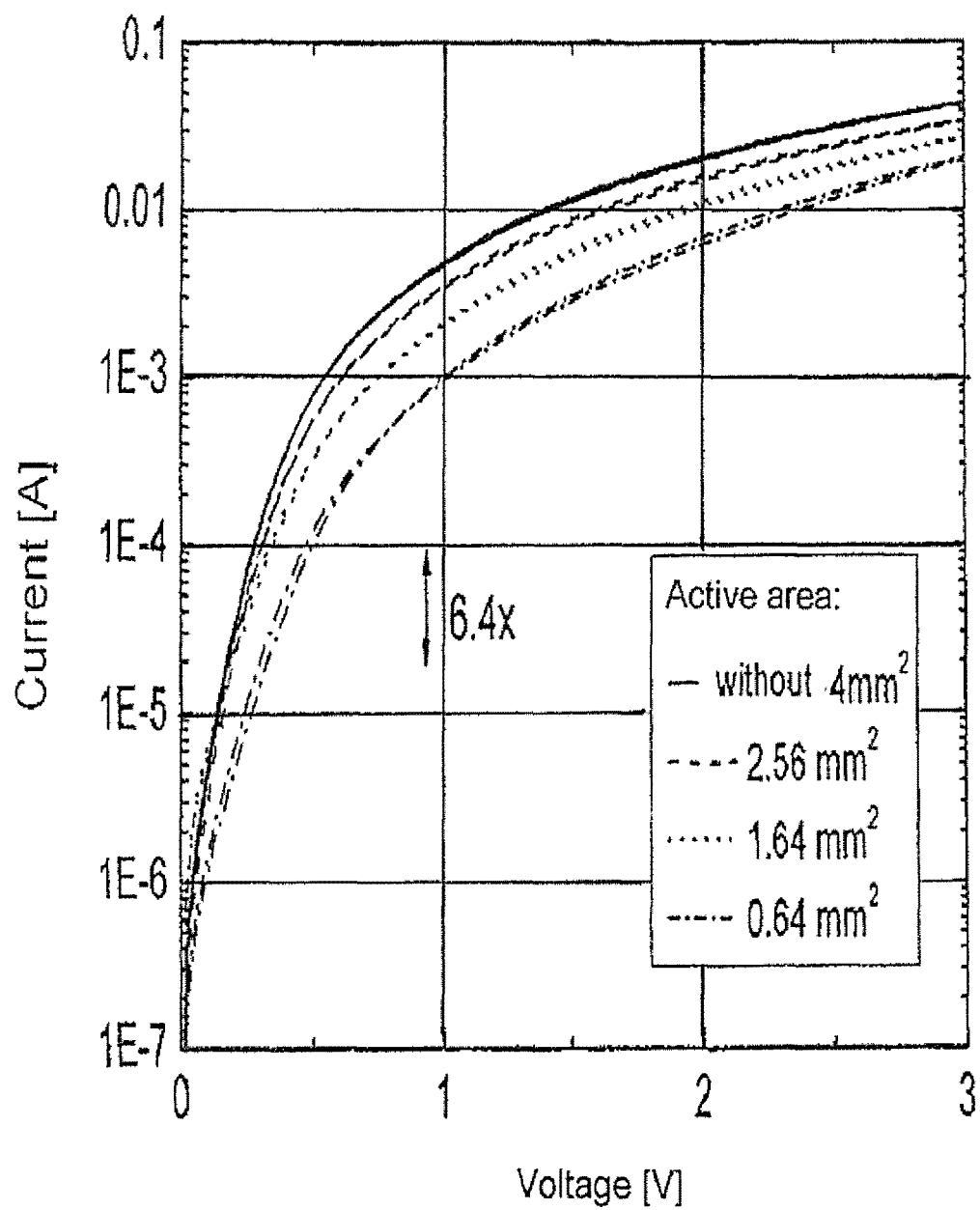
FIG. 14 shows a graphical diagram of the current as a function of the voltage.

FIG. 14 shows a graphical diagram of the current as a function of the voltage between emitter electrode and control electrode with a non-connected collector electrode according to FIG. 3. The sample was baked for two hours at 150° C. As a result of use of a patterned electrically insulating functional layer 22, the active area can be successively reduced. The current flowing through the entire device is thereby reduced. However, since the current scales with the active area (about a factor of 6.4), the current densities remain approximately constant however.

Figure 15:
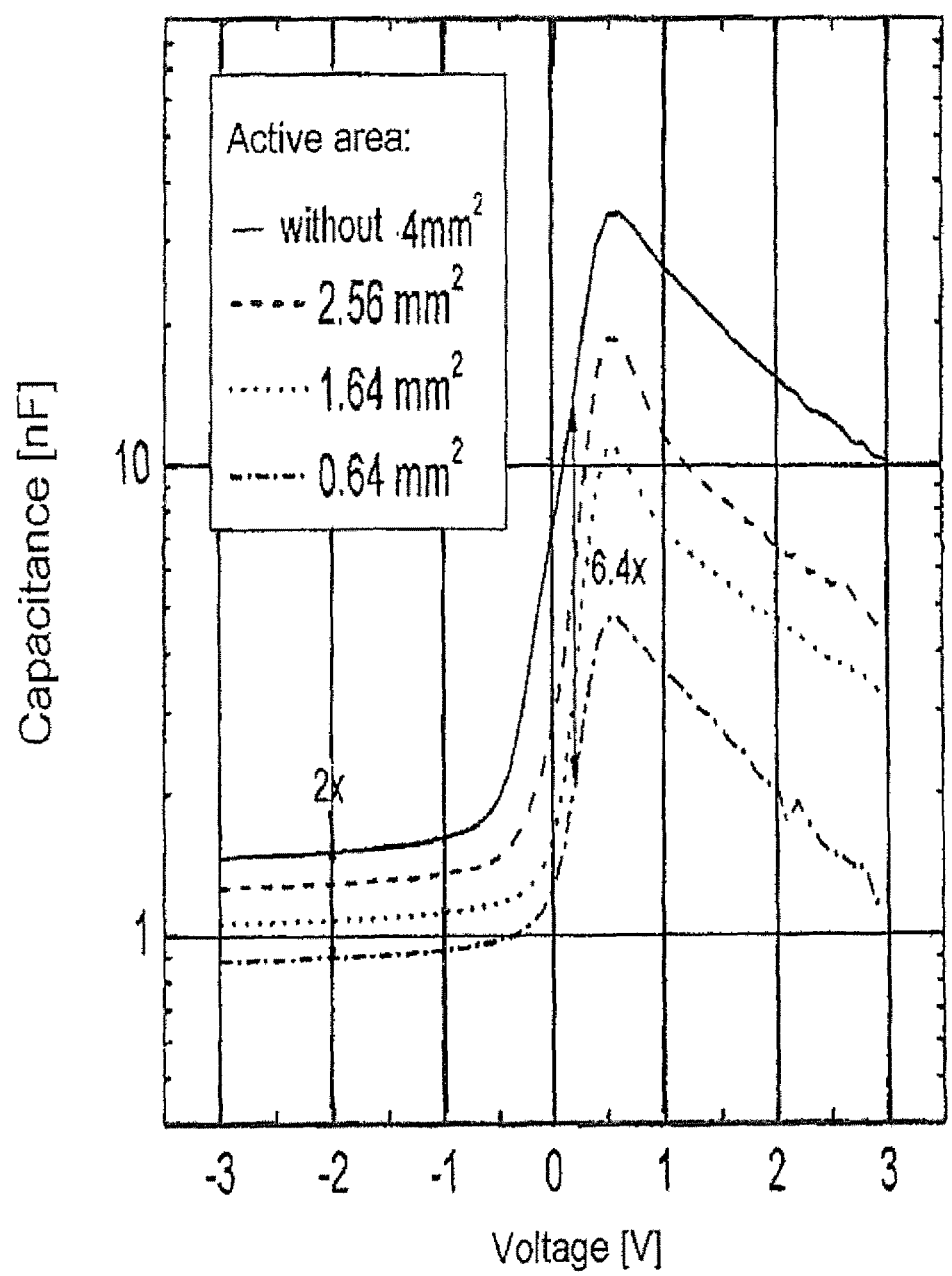
FIG. 15 shows a graphical diagram of the capacitance as a function of the voltage.

FIG. 15 shows a graphical diagram of the capacitance as a function of the voltage for the capacitance between emitter electrode and control electrode with a non-connected collector electrode according to FIG. 3. The sample was baked for two hours at 150° C. In the forward direction (positive voltages) charge carriers accumulate ahead of the control electrode 19 which is surrounded by a thin native oxide layer. This is formed in the case of the Al electrode used by supplying air after fabrication of the control electrode 19. A native oxide is thereby formed whose thickness saturates after about 3 nm. The accumulation of charge carriers at this oxide leads to a substantial increase in the capacitance. In the case of a passive patterning in which the patterned electrically insulating functional layer 22 was applied directly to the control electrode 19, as can be seen in FIG. 3, the capacitance must vary accordingly with the area. An accumulation of charge carriers at the patterned electrically insulating functional layer 22 certainly results in a capacitance. However, as a result of the layer thickness of the patterned electrically insulating functional layer 22 (50 nm), this is at least ten times lower. In the backward direction (negative voltages), the semiconductor becomes depleted and the measured capacitance reflects the layer thickness of the transport layer (about 100 nm). Since the patterned electrically insulating functional layer 22 is a similar thickness and only occurs in a part of the device, the influence on the capacitance in the backward direction is smaller. The experimental results in FIG. 15 confirm this.

Figure 16:
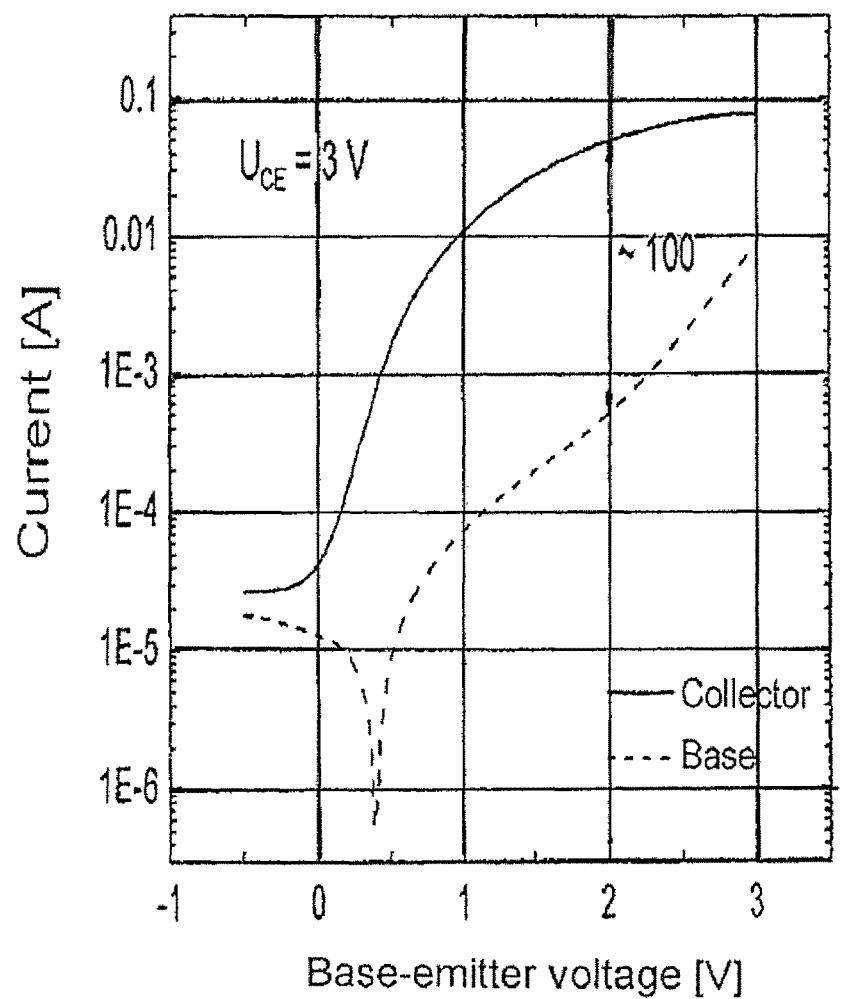
FIG. 16 shows a graphical diagram of the current as a function of the base emitter voltage.

FIG. 16 shows a base run at an operating voltage of 3 V of a vertical organic transistor according to FIG. 3. The sample was baked for two hours at 150° C. The reference current density of 1000 mA/cm$^2$ is achieved approximately at 25.6 mA with the active area of 2.56 mm$^2$ set by passive patterning, which is still below the base emitter voltage of 1.5 V. Even in the on-state a current amplification of 100 is achieved at a current of 50 mA.

Figure 17:
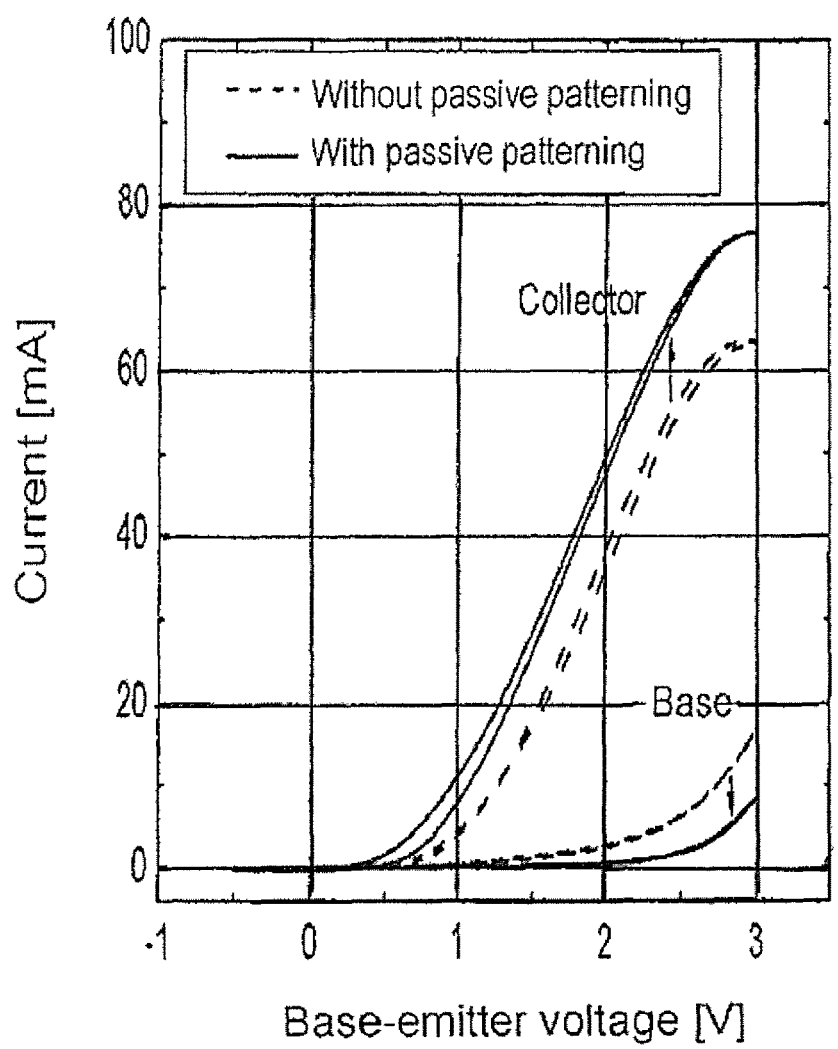
FIG. 17 shows a graphical diagram of the current as a function of the base emitter voltage.

FIG. 17 shows a graphical diagram of the current as a function of the base emitter voltage. Base runs for a sample without passive patterning (layer arrangement according to FIG. 3 without patterning functional layer 22) and for a sample with passive patterning (cf. FIG. 3), Both samples were baked at 150° C. The lower two lines correspond to the currents of the control electrode 19 (base) whereas the upper two lines correspond to the currents of the collector. By using passive patterning the base current can be lowered. In particular, current which had previously flowed into the base electrode in the non-active regions are now either stopped or also flow to the collector electrode. Interestingly, despite the reduction of the active area, the current of the passively patterned sample can be increased. One reason for this must be the better voltage distribution within the resistive base electrode when this must guide less current and therefore can better ensure the corresponding potential for the on-state.

Figure 18:
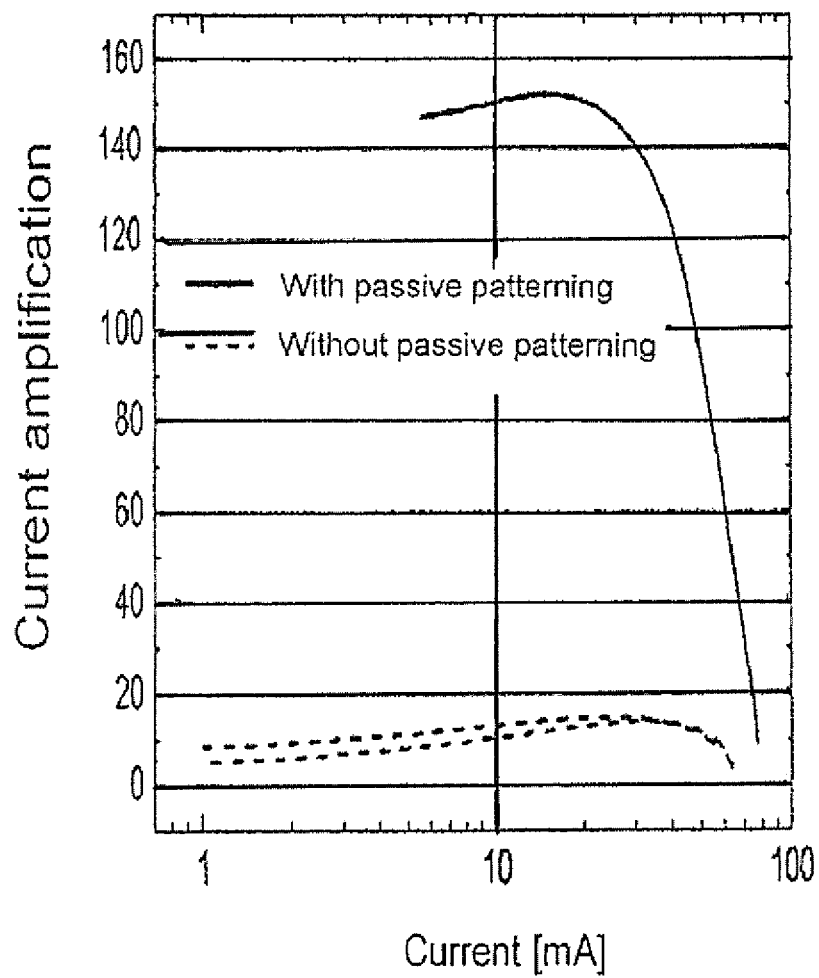
FIG. 18 shows a graphical diagram of the current amplification as a function of the current.

FIG. 18 shows a graphical diagram of the current amplification as a function of the current. The current amplification for the two samples from FIG. 17 is compared. A sample with passive patterning still reaches an amplification of 100 even at 50 mA. A comparative sample without passive patterning does not provide a current amplification greater than 20 for any of the currents. As a result of fluctuations of the overlap of the electrodes, fluctuations can also occur in the current amplification and therefore higher values can also be achieved. However, samples with passive patterning always reached higher current amplifications when compared directly.

Figure 19:
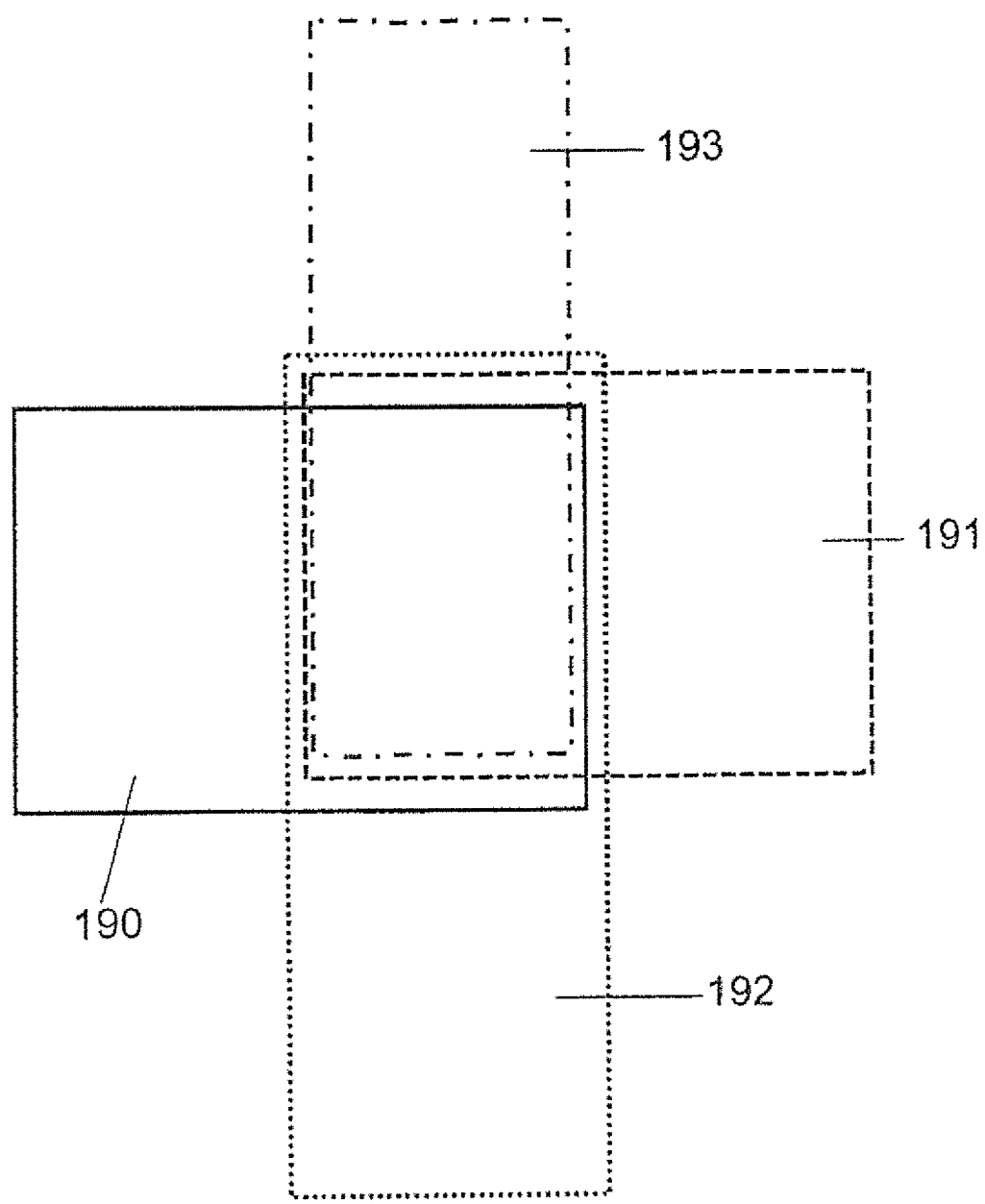
FIG. 19 shows a schematic diagram of an arrangement of electrodes for a vertical organic complementary inverter.

FIG. 19 shows a possible arrangement of the electrodes for a vertical organic complementary inverter. The circuit consists of an electrode 190 for the reference potential (left), an electrode 191 for the operating potential (right), an electrode 192 for triggering the control electrodes of the two transistors used (bottom) and an electrode 193 used for reading out the inverted signal. The circuit has the property of converting an incoming signal with a specific voltage difference with respect to the reference potential into an outgoing signal at which the specific voltage difference with respect to the operating potential is now adopted.

Figure 20:
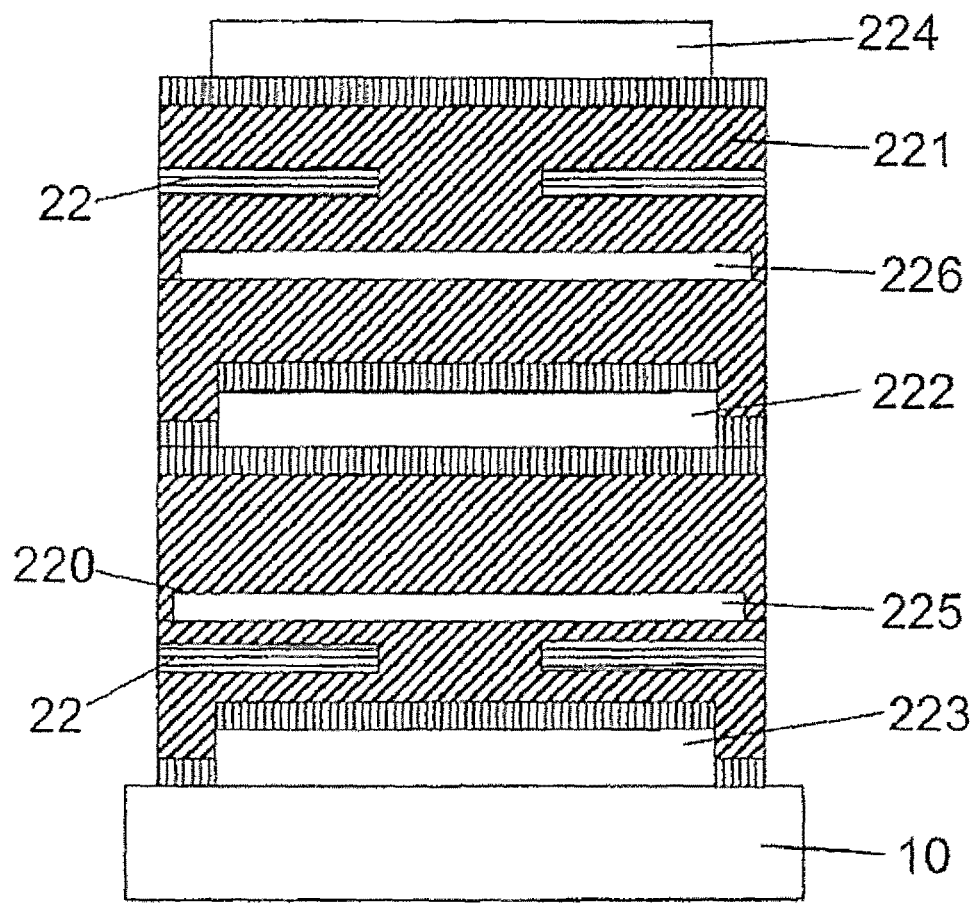
FIG. 20 shows a schematic diagram of a layer structure with two vertical organic transistors for an inverter in cross-section.

FIG. 20 shows an application in which the passive patterning is used to build a vertically stacked inverter consisting of two vertical organic transistors 220 and 221. One of the vertical organic transistors here is electron-conducting (n-type) and the other is hole-conducting (p-type). Both transistors 220, 221 now share the middle electrode 222 which now functions as emitter or as collector for both transistors 220, 221 depending on the configuration. Outer electrodes 223, 224, uppermost and lowermost electrode, then function accordingly as collector or emitter. Both transistors 220, 221 have their own control electrode 225, 226, control electrode 225 of the lower transistor 220 and control electrode 226 of the upper transistor 221.

In FIG. 20 the passive patterning formed by means of the patterning functional layers 22 is adapted in such a manner that charge carriers flow in each case from the outer electrodes 223, 224 to the middle electrode 222. The outer electrodes 223, 224 are provided with a constant operating voltage. The two control electrodes 225, 226 each carry the same signal and be interconnected outside the device. Due to a variation of the input signal at the control electrodes 225, 226, as a result of the voltage divider formed by the series connection of n-type transistor and p-type transistor, the voltage of the middle electrode varies in such a manner that it takes on a logically opposite state compared with the input signal.

In the embodiment in FIG. 20, the outer electrodes 223, 224 and the middle electrode 222 are in contact with injection layers on one side or two sides.

One of the two transistors 220, 221 can be replaced by a resistive device, the electrical resistance whereof has a value which is higher than the resistance of the remaining transistor in the logical off state and lower than the electrical resistance which the remaining transistor has in the logical on-state. The resistive device can have a passive patterning with one or more electrically insulating layers which serve to adapt the resistance ratios. The resistive device can be provided by a vertical organic transistor whose base contact is connected either to the emitter or to the collector, if desired via a resistive device so that the vertical organic transistor has a resistance which only depends on the decaying operating voltage.

The two transistors, whether this is in the embodiment in FIG. 20, the transistors 220, 221 there or other embodiments, form a voltage divider in the inverter circuit via which the operating voltage decays. Depending on what the resistance ratios of the two transistors is, a potential is set in the middle electrode which "runs opposite" to the input potential. One possibility is to replace a transistor by a resistance. The resistance can ultimately also be made possible by a transistor whose base is connected to the emitter or collector. The advantage consists in that two n- or two p-transistors can be used, of which one transistor functions as a resistance.

Figure 21:
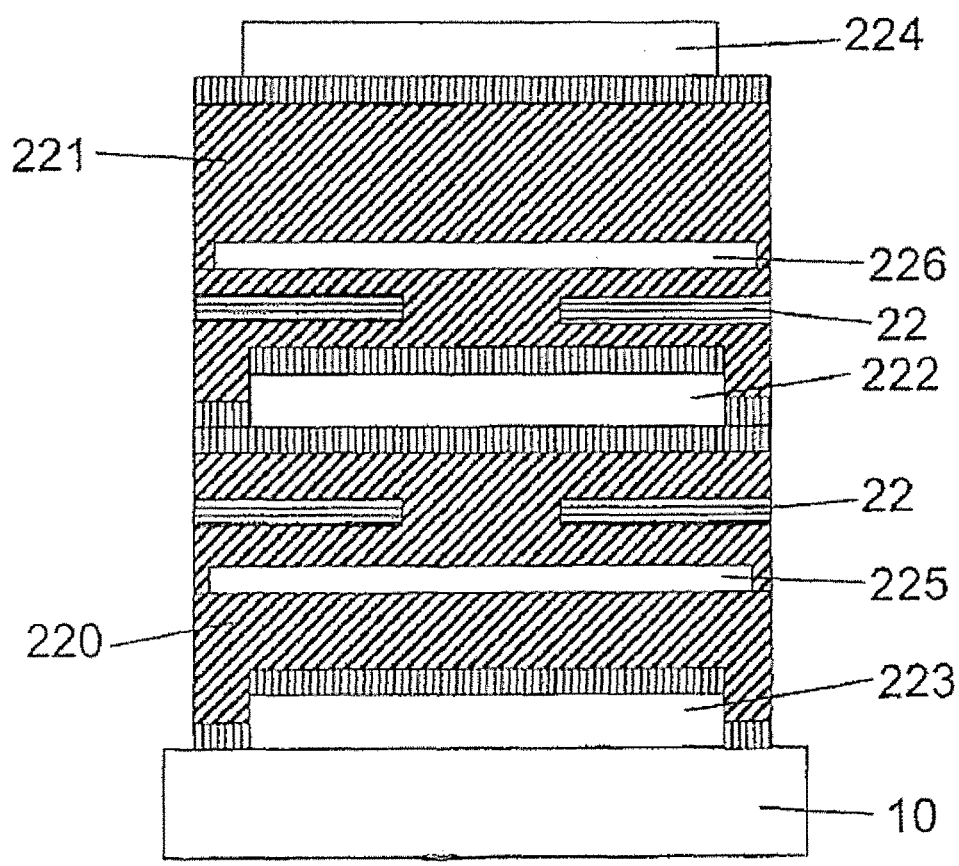
FIG. 21 shows a schematic diagram of the layer structure from FIG. 20, where the electrically insulating functional layers are shifted inwards.

FIG. 21 shows a modification of FIG. 20 in which the charge carriers flow from the middle electrode 222 to the outer electrodes 223, 224 and the patterned electrically insulating functional layers 22 are introduced in the transport layer which abut against the middle electrode 222.

Figure 22:
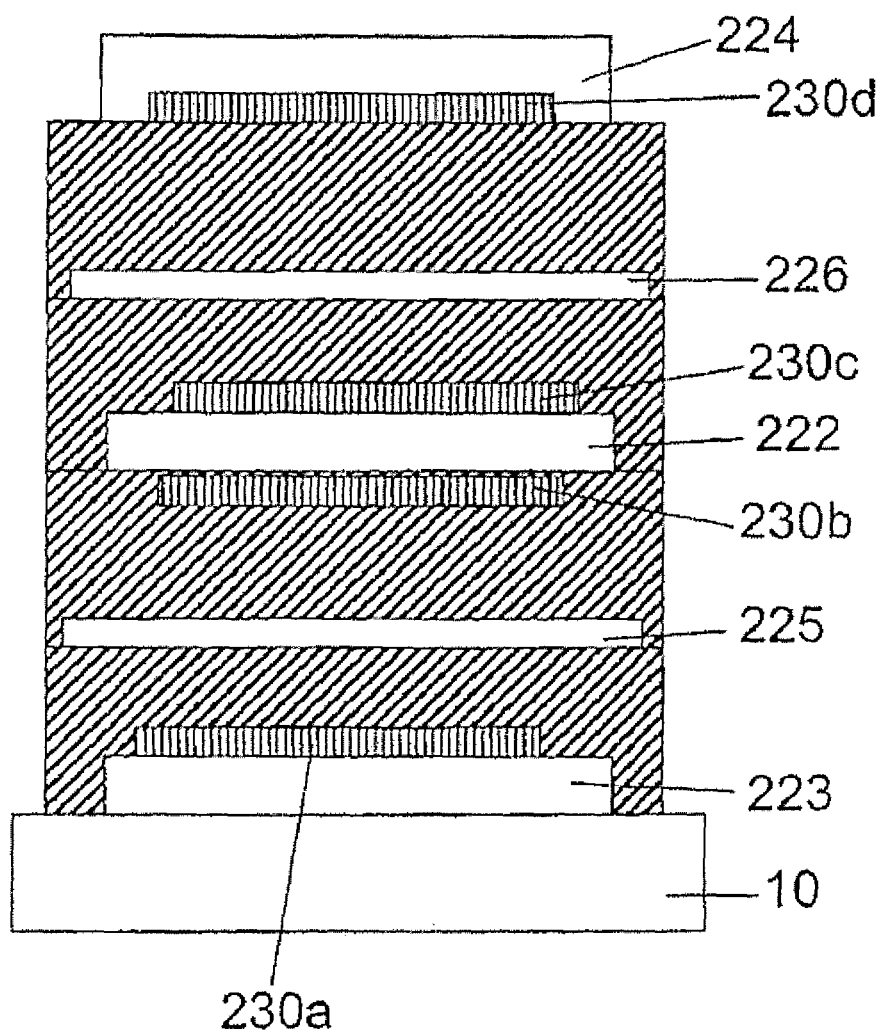
FIG. 22 shows a schematic diagram of a layer structure with two vertical organic transistors for an inorganic complementary inverter with patterning injection layers.

FIG. 22 shows a vertical organic complementary inverter in which an active patterning is used. To this end patterned injection layers 230a, . . . , 230d abutting against the outer electrodes 223, 224 and the middle electrode 222 are applied. This inverter circuit functions regardless of the polarity of the operating voltage.

Figure 23:
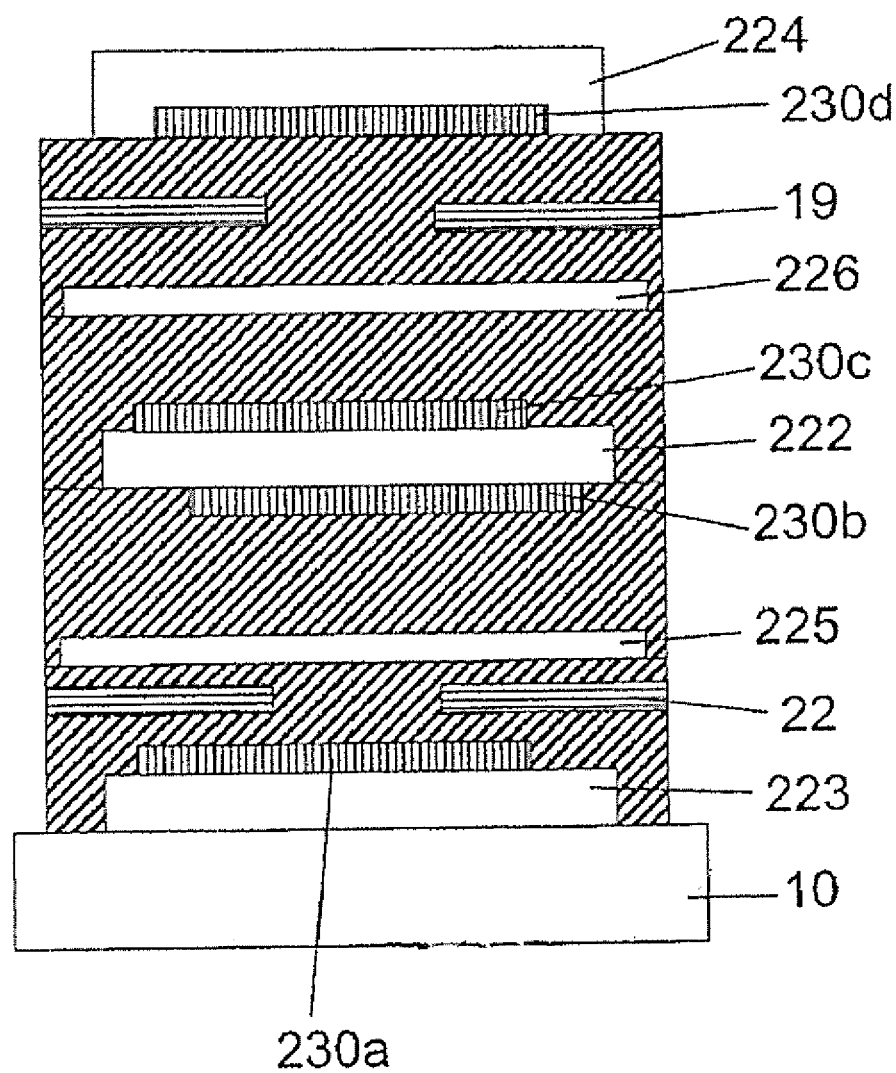
FIG. 23 shows a schematic diagram of a layer structure with two vertical organic transistors for an inverter with patterning injection layers and electrically insulating functional layers.

FIG. 23 shows a combination of passive patterning and active patterning according to FIGS. 21 and 22 in a vertical organic transistor. The flow of charge carriers is defined by the position of the patterned electrically insulating functional layers 19 from the outer to the middle electro 222, 223, 224.

Figure 24:
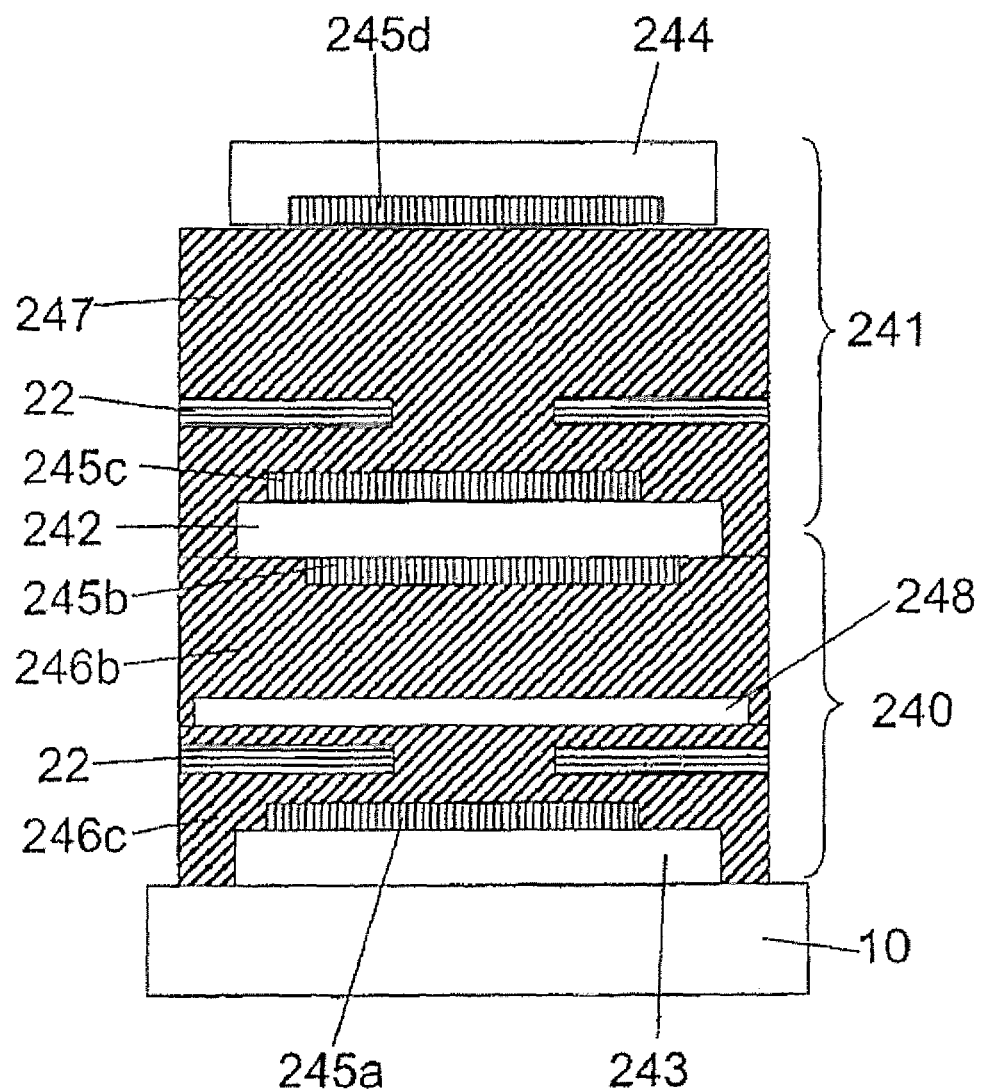
FIG. 24 shows a schematic diagram of a layer structure with a vertical organic transistor and a device disposed thereon.

FIG. 24 shows a combination of a vertical organic transistor 240 using active and passive patterning with a device 241 which was stacked on the vertical organic transistor 240. The device 241 can also have a passive patterning in order, for example, to adapt the current densities. The device 241 can be an organic light-emitting diode or an information-storing layer, for example, a resistive or capacitive storage device. The vertical organic transistor 240 is interconnected to the upper device 241 by means of a middle electrode 242 which can, but need not, be guided outside the active area. An electrode 243 is formed on the substrate 10. A counter-electrode 244 is formed at the top on the layer stack.

In the example shown the device 241 and the vertical organic transistor 240 have patterned injection layers 245a, . . . , 245d for an active patterning.

Transport layers (molecular layers) 246a, 246b, 247 are disposed between the electrode 243 and the middle electrode 242 as well as the counter-electrode 244 and the middle electrode 242. The control electrode 248 is disposed between the transport layers 246a, 246b of the vertical organic transistor 240.

Figure 25:
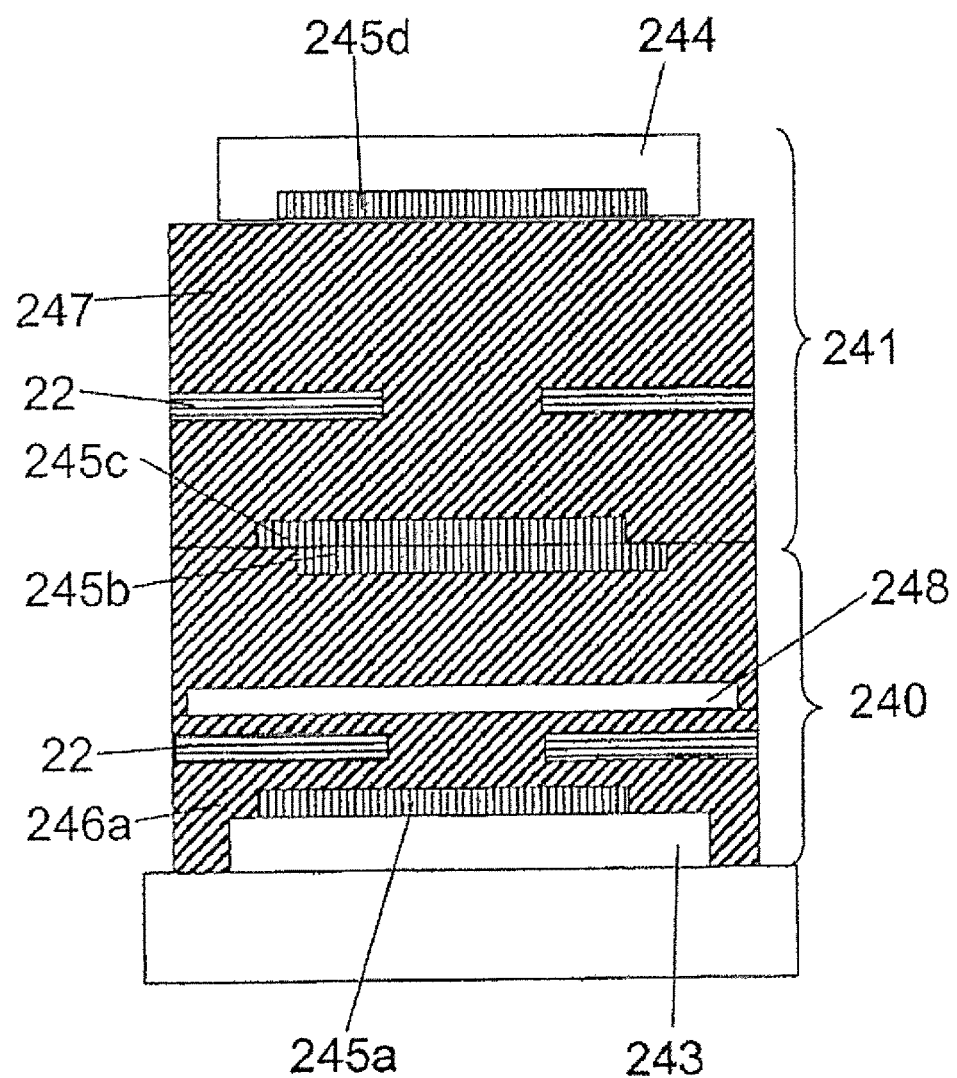
FIG. 25 shows a schematic diagram of a layer structure with a vertical organic transistor and a device disposed thereon without middle electrode and FIG. 26 shows a schematic diagram of a layer structure with a vertical organic transistor and a device disposed thereon without middle electrode.

FIG. 25 shows a vertical organic transistor 240 with an upper device 241 without using the middle electrode 242 from FIG. 24. Here two patterned injection layers 245b, 245c are used which can be of the same type and also of different type.

Figure 26:
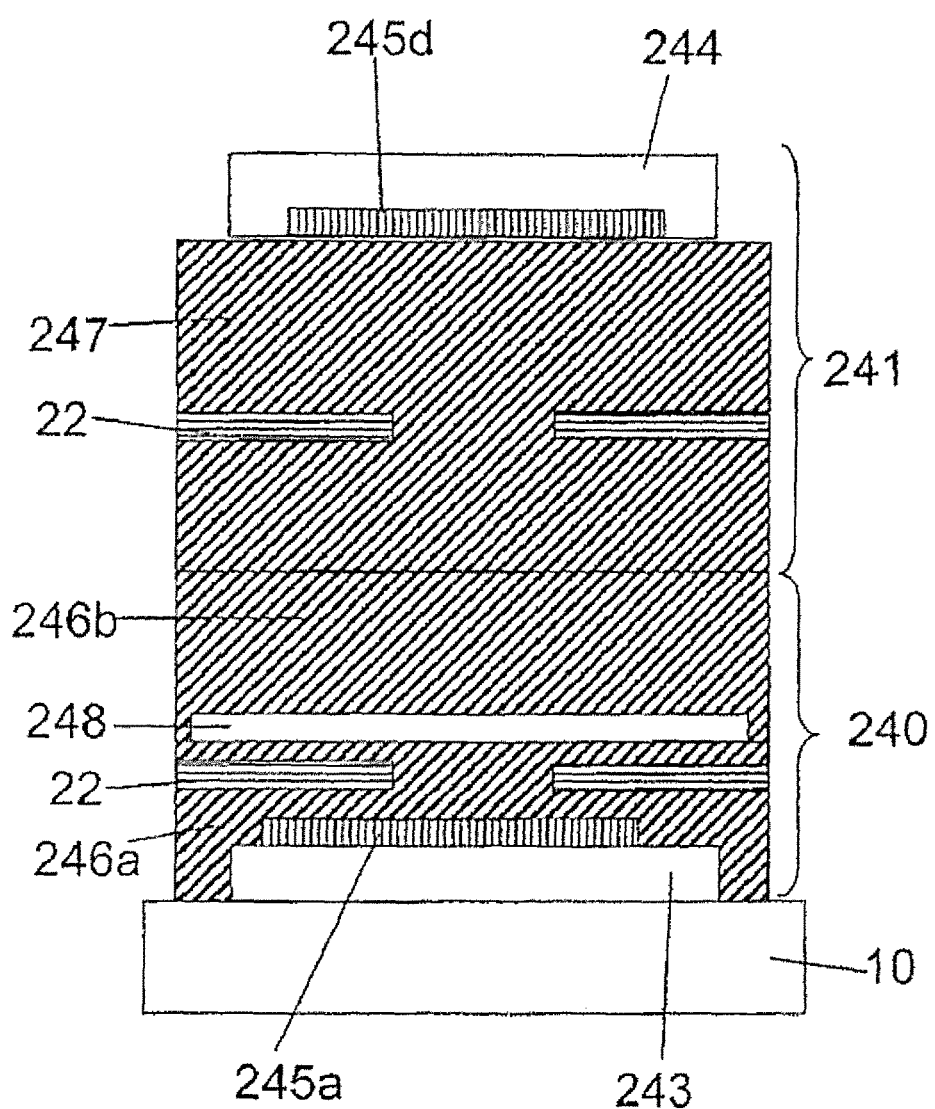

FIG. 26 shows an embodiment of the combination of a vertical organic transistor 240 with an upper device 241 in which the middle electrode 242 from FIG. 24 is dispensed with and no injection layers (cf. FIG. 25) are used. However it is desired that the charge carriers can pass from the upper transport layer 246b of the vertical organic transistor 240 into the transport layer 247 of the upper device 241.

The features of the invention disclosed in the preceding description, the claims and the drawings can be important both individually and in any combination for the implementation of the invention in its various embodiments.

The invention claimed is:

1. A vertical organic transistor comprising a layer structure on a substrate, said layer structure comprising:
 an electrode,
 a counter-electrode, and an electronically active layer arrangement which is disposed between the electrode and the counter-electrode; wherein the electronically active layer arrangement comprises the following layers:
a middle electrode which is designed to allow a passage of electric charge carriers injected by the electrode into the electronically active layer arrangement through the middle electrode so that during operation the injected electric charge carriers can be transported from the electrode through the electronically active layer arrangement to the counter-electrode,
a first organic layer of a first organic semiconductor material disposed between the middle electrode and the electrode,
a second organic layer of a second organic semiconductor material disposed between the middle electrode and the counter-electrode, and
one or more functional layers which in the electronically active layer arrangement, at least in sections, structure an active region in which during operation an operating current can flow between electrode and counter-electrode through the electronically active layer arrangement as well as a non-active region which is disposed outside the active region, wherein the surface area of each of the one or more functional layers is less than the surface area of the electronically active layer arrangement.

2. The transistor according to claim 1, wherein an electrical operating current in the active region is at least three orders of magnitude greater than a fault current in the non-active region.

3. The transistor according to claim 1, wherein the one or more functional layers comprise an electrically insulating layer which extends at least in the non-active region.

4. The transistor according to claim 3, wherein the electrically insulating layer is disposed adjacent to the middle electrode.

5. The transistor according to claim 3, wherein the electrically insulating layer is disposed adjacent to the electrode or the counter-electrode.

6. The transistor according to claim 1, wherein the one or more functional layers have a patterned injection layer which extends at least in the active region.

7. The transistor according to claim 6, wherein the patterned injection layer comprises an electrically doped semiconductor material in which an electrical dopant is embedded in a matrix material.

8. The transistor according to claim 6, wherein the patterning injection layer comprises a dopant layer region consisting of a doping material, wherein the doping material is an electrical dopant for the first organic semiconductor material of the first organic layer, or an electrical dopant for the second organic semiconductor material of the second organic layer.

9. The transistor according to claim 1, wherein the electronically active layer arrangement comprises a functional layer inhibiting charge carrier injection which extends at least in the non-active region.

10. The transistor according to claim 1 wherein at least one of the following layers is multilayered: the electrode, the counter-electrode, the first organic layer, the second organic layer, and the one or more functional layers.

11. The transistor according to claim 1, wherein the middle electrode has one or more openings through which a touching contact can be formed between a region of the electronically active layer arrangement on one side of the middle electrode and a region of the electronically active layer arrangement on an opposite side of the middle electrode.

12. A circuit arrangement comprising one or a plurality of vertical organic transistors according to claim 1.

13. An arrangement comprising a vertical organic transistor according to claim 1 and an organic device which is disposed as an additional layer structure on the vertical organic transistor and is functionally connected therewith.

14. A method for fabricating a vertical organic transistor in which a layer structure having the following layers is fabricated on a substrate:
an electrode,
a counter-electrode, and
an electronically active layer arrangement which is disposed between the electrode and the counter-electrode, wherein the electronically active layer arrangement comprises the following layers:
a middle electrode which is designed to allow a passage of electric charge carriers injected by the electrode into the electronically active layer arrangement through the middle electrode so that during operation the injected electric charge carriers can be transported from the electrode through the electronically active layer arrangement to the counter-electrode,
a first organic layer of a first organic semiconductor material disposed between the middle electrode and the electrode,
a second organic layer of a second organic semiconductor material disposed between the middle electrode and the counter-electrode, and
one or more functional layers which in the electronically active layer arrangement, at least in sections, structure an active region in which during operation an operating current can flow between electrode and counter-electrode through the electronically active layer arrangement as well as a non-active region which is disposed outside the active region, wherein the surface area of each of the one or more functional layers is less than the surface area of the electronically active layer arrangement.

15. The circuit arrangement according to claim 12, wherein the circuit arrangement comprises an inverter.

16. The circuit arrangement according to claim 12, wherein the circuit arrangement comprises a logic gate.

17. The circuit arrangement according to claim 16, wherein the logic gate is an OR or NAND gate.

* * * * *